United States Patent
Matsubayashi

(10) Patent No.: US 9,859,268 B2
(45) Date of Patent: Jan. 2, 2018

(54) CONTENT ADDRESSABLE MEMORY

(75) Inventor: Daisuke Matsubayashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/469,175

(22) Filed: May 11, 2012

(65) Prior Publication Data

US 2012/0292614 A1    Nov. 22, 2012

(30) Foreign Application Priority Data

May 17, 2011   (JP) ................. 2011-110391

(51) Int. Cl.
  H01L 29/10    (2006.01)
  H01L 27/02    (2006.01)
  G11C 15/04    (2006.01)
  H01L 27/06    (2006.01)
  H01L 27/105   (2006.01)

(52) U.S. Cl.
  CPC .......... H01L 27/0207 (2013.01); G11C 15/04 (2013.01); H01L 27/0688 (2013.01); H01L 27/1052 (2013.01)

(58) Field of Classification Search
  CPC ... G11C 15/04; G11C 15/043; H01L 27/0207; H01L 27/0688
  USPC ...................... 257/43, 57, E21.677
  See application file for complete search history.

(56) References Cited

U.S. PATENT DOCUMENTS

| 3,701,980 A | 10/1972 | Mundy |
| 3,723,979 A | 3/1973 | Mundy |
| 3,750,115 A | 7/1973 | Mundy |
| 4,466,081 A | 8/1984 | Masuoka |
| 5,146,300 A | 9/1992 | Hamamoto et al. |
| 5,319,589 A * | 6/1994 | Yamagata et al. ......... 365/49.15 |
| 5,731,856 A | 3/1998 | Kim et al. |
| 5,744,864 A | 4/1998 | Cillessen et al. |

(Continued)

FOREIGN PATENT DOCUMENTS

| EP | 0843360 A | 5/1998 |
| EP | 0843361 A | 5/1998 |

(Continued)

OTHER PUBLICATIONS

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

Primary Examiner — Matthew Landau
Assistant Examiner — Mark Hatzilambrou
(74) Attorney, Agent, or Firm — Fish & Richardson P.C.

(57) ABSTRACT

A content addressable memory has many elements in one memory cell; thus, the area of one memory cell tends to be large. In view of the above, it is an object of an embodiment of the present invention to reduce the area of one memory cell. Charge can be held with the use of a channel capacitance in a reading transistor (capacitance between a gate electrode and a channel formation region). In other words, the reading transistor also serves as a charge storage transistor. One of a source and a drain of a charge supply transistor is electrically connected to a gate of the reading and charge storage transistor.

23 Claims, 19 Drawing Sheets

(56) References Cited

U.S. PATENT DOCUMENTS

| | | | |
|---|---|---|---|
| 5,888,872 A * | 3/1999 | Gardner | H01L 21/76838 257/E21.507 |
| 5,952,692 A | 9/1999 | Nakazato et al. | |
| 6,060,723 A | 5/2000 | Nakazato et al. | |
| 6,127,702 A | 10/2000 | Yamazaki et al. | |
| 6,169,308 B1 | 1/2001 | Sunami et al. | |
| 6,211,531 B1 | 4/2001 | Nakazato et al. | |
| 6,294,274 B1 | 9/2001 | Kawazoe et al. | |
| 6,522,562 B2 | 2/2003 | Foss | |
| 6,563,174 B2 | 5/2003 | Kawasaki et al. | |
| 6,642,574 B2 | 11/2003 | Sunami et al. | |
| 6,727,522 B1 | 4/2004 | Kawasaki et al. | |
| 6,731,526 B2 | 5/2004 | Inoue | |
| 6,753,568 B1 | 6/2004 | Nakazato et al. | |
| 6,825,527 B2 | 11/2004 | Sunami et al. | |
| 6,873,532 B2 | 3/2005 | Foss | |
| 6,888,730 B2 | 5/2005 | Foss et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,132,713 B2 | 11/2006 | Nakazato et al. | |
| 7,211,825 B2 | 5/2007 | Shih et al | |
| 7,216,284 B2 * | 5/2007 | Hsu et al. | 714/766 |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0090770 A1* | 7/2002 | Yamazak et al. | 438/155 |
| 2002/0132454 A1 | 9/2002 | Ohtsu et al. | |
| 2003/0189401 A1 | 10/2003 | Kido et al. | |
| 2003/0217321 A1 | 11/2003 | Hsu et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2011/0089417 A1 | 4/2011 | Yamazaki et al. | |
| 2011/0101332 A1 | 5/2011 | Yamazaki et al. | |
| 2011/0101334 A1 | 5/2011 | Yamazaki et al. | |
| 2011/0101339 A1 | 5/2011 | Yamazaki et al. | |
| 2011/0101351 A1* | 5/2011 | Yamazaki | 257/57 |
| 2012/0262979 A1 | 10/2012 | Matsubayashi | |
| 2012/0273858 A1 | 11/2012 | Takahashi | |
| 2012/0287693 A1 | 11/2012 | Furutani | |

FOREIGN PATENT DOCUMENTS

| | | |
|---|---|---|
| EP | 0892440 A | 1/1999 |
| EP | 0908954 A | 4/1999 |
| EP | 0935291 A | 8/1999 |
| EP | 1 737 044 A1 | 12/2006 |
| EP | 2 226 847 A2 | 9/2010 |
| JP | 60-198861 A | 10/1985 |
| JP | 63-096799 A | 4/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-166761 A | 7/1991 |
| JP | 05-101681 A | 4/1993 |
| JP | 05-251705 A | 9/1993 |
| JP | 07-121444 A | 5/1995 |
| JP | 08-264794 A | 10/1996 |
| JP | 11-111929 A | 4/1999 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-093178 A | 3/2002 |
| JP | 2002-289859 A | 10/2002 |
| JP | 2002-373493 A | 12/2002 |
| JP | 2003-086000 A | 3/2003 |
| JP | 2003-086808 A | 3/2003 |
| JP | 2003-272386 A | 9/2003 |
| JP | 2004-103957 A | 4/2004 |

(56) References Cited

FOREIGN PATENT DOCUMENTS

| JP | 2004-128266 A | 4/2004 |
|---|---|---|
| JP | 2004-273614 A | 9/2004 |
| JP | 2004-273732 A | 9/2004 |
| JP | 2004-295967 A | 10/2004 |
| JP | 2011-171702 A | 9/2011 |
| WO | 2004/114391 A1 | 12/2004 |
| WO | WO-2011/052396 | 5/2011 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

(56) References Cited

OTHER PUBLICATIONS

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compounds with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

\* cited by examiner

CONTENT ADDRESSABLE MEMORY

BACKGROUND OF THE INVENTION

1. Field of the Invention

The technical field of the present invention relates to a semiconductor device including a content addressable memory.

2. Description of the Related Art

The content addressable memory (CAM) is a memory that can determine whether data that matches for a set of data called data word is stored in the memory.

For example, the CAM determines if there is a match for a data word such as "10110".

As the CAM, a binary CAM (BCAM), a ternary CAM (TCAM), and the like can be given.

In the BCAM, either of two values, "Low (0)" or "High (1)", is stored in each memory cell.

In the TCAM, any one of three values, "Low (0)", "High (1)", or "X (Don't Care)", is stored in each memory cell of a memory circuit.

Note that "X (Don't Care)" is a value which will match any input value in reading operation.

As an example of the CAM, a CAM including a capacitor disclosed in Patent Document 1 can be given.

REFERENCE

Patent Document

[Patent Document 1] Japanese Published Patent Application No. 2003-272386

SUMMARY OF THE INVENTION

A CAM has many elements in one memory cell; thus, the area of one memory cell tends to be large.

In view of the above, it is an object of an embodiment of the present invention to reduce the area of one memory cell.

Charge can be held with the use of a channel capacitance in a reading transistor (capacitance between a gate electrode and a channel formation region).

In other words, the reading transistor also serves as a charge storage transistor.

One of a source and a drain of a charge supply transistor is electrically connected to a gate of the reading and charge storage transistor.

Here, a semiconductor used in the reading and charge storage transistor is preferably a semiconductor containing silicon for increasing reading speed. For a further increase in reading speed, the semiconductor containing silicon preferably has crystallinity.

In the case where the amount of leakage of the charge supply transistor is large, the channel capacitance in the reading and charge storage transistor has to be increased and accordingly the area of the channel formation region of the reading and charge storage transistor needs to be increased.

For this reason, it is preferable to use an oxide semiconductor in the charge supply transistor.

The oxide semiconductor has a wider bandgap than silicon.

The wider the bandgap of a semiconductor used in a transistor is, the smaller the off-state current flowing through the transistor is.

Consequently, the amount of leakage between a source and a drain (the off-state current) of a transistor that uses an oxide semiconductor at least in a channel formation region is significantly smaller than that of a transistor that uses a semiconductor containing silicon.

In the case of using an oxide semiconductor as the semiconductor used in the charge supply transistor, the area of the channel formation region of the reading and charge storage transistor can be reduced.

Note that in the case where the amount of leakage of the charge supply transistor is large, refresh operation is needed.

However, in the case of using a transistor with significantly small amount of leakage like the transistor that uses an oxide semiconductor, the number of refresh operations can be reduced.

A smaller number of refresh operations enables smaller power consumption.

Thus, usage of an oxide semiconductor in the charge supply transistor brings about a secondary effect of reducing the number of refresh operations and reducing the power consumption.

An embodiment of the present invention can provide a semiconductor device which includes a first transistor, a second transistor, a third transistor, a fourth transistor, a first wiring, a second wiring, a third wiring, and a fourth wiring. The first wiring is electrically connected to one of a source and a drain of the first transistor and one of a source and a drain of the third transistor. The second wiring is electrically connected to one of a source and a drain of the second transistor and one of a source and a drain of the fourth transistor. The third wiring is electrically connected to a gate of the first transistor and a gate of the second transistor. The fourth wiring is electrically connected to the other of the source and the drain of the third transistor and the other of the source and the drain of the fourth transistor. A gate of the third transistor is electrically connected to the other of the source and the drain of the first transistor. A gate of the fourth transistor is electrically connected to the other of the source and the drain of the second transistor. Semiconductor layers of the first transistor and the second transistor are oxide semiconductor layers. Semiconductor layers of the third transistor and the fourth transistor are semiconductor layers containing silicon.

Further, a semiconductor device in which the semiconductor layer of the third transistor and the semiconductor layer of the fourth transistor share the same layer can be provided.

Another embodiment of the present invention can provide a semiconductor device including a first transistor, a second transistor, a third transistor, a fourth transistor, a fifth transistor, a first wiring, a second wiring, a third wiring, a fourth wiring, and a fifth wiring. The first wiring is electrically connected to one of a source and a drain of the first transistor and one of a source and a drain of the third transistor. The second wiring is electrically connected to one of a source and a drain of the second transistor and one of a source and a drain of the fourth transistor. The third wiring is electrically connected to a gate of the first transistor and a gate of the second transistor. The fourth wiring is electrically connected to one of a source and a drain of the fifth transistor. The fifth wiring is electrically connected to a gate of the fifth transistor. A gate of the third transistor is electrically connected to the other of the source and the drain of the first transistor. A gate of the fourth transistor is electrically connected to the other of the source and the drain of the second transistor. The other of the source and the drain of the fifth transistor is electrically connected to the other of the source and the drain of the third transistor and the other of the source and the drain of the fourth transistor. Semiconductor layers of the first transistor and the second transistor are oxide semiconductor layers. Semiconductor layers of the third transistor, the fourth transistor, and the fifth transistor are semiconductor layers containing silicon.

Further, a semiconductor device in which the first transistor is located over the third transistor; the second transistor is located over the fourth transistor; and the semiconductor layer of the third transistor, the semiconductor layer of the fourth transistor, and the semiconductor layer of the fifth transistor share the same layer can be provided.

A semiconductor device in which the semiconductor layer of the first transistor overlaps with the semiconductor layer of the third transistor and in which the semiconductor layer of the second transistor overlaps with the semiconductor layer of the fourth transistor can be provided.

Further, a semiconductor device can be provided, in which a part of the semiconductor layer of the first transistor is electrically connected to a part of the semiconductor layer of the third transistor through a first connection electrode; a part of the semiconductor layer of the second transistor is electrically connected to a part of the semiconductor layer of the fourth transistor through a second connection electrode; the part of the semiconductor layer of the first transistor is in contact with the first connection electrode; another part of the semiconductor layer of the first transistor is in contact with a gate electrode functioning as the gate of the third transistor; the part of the semiconductor layer of the second transistor is in contact with the second connection electrode; another part of the semiconductor layer of the second transistor is in contact with a gate electrode functioning as the gate of the fourth transistor; and the first connection electrode, the second connection electrode, the gate electrode of the third transistor, and the gate electrode of the fourth transistor are formed in the same step.

A semiconductor device in which the first transistor, the second transistor, the third transistor, and the fourth transistor are included in a memory cell and in which charge is held in the memory cell using a channel capacitance in the third transistor and a channel capacitance in the fourth transistor can be provided.

The area of one memory cell can be reduced by holding charge with the use of a channel capacitance in a reading transistor.

A semiconductor having crystallinity and containing silicon is used in the reading and charge storage transistor, and an oxide semiconductor is used in the charge supply transistor; consequently, the reading speed can be improved and the area of one memory cell can be reduced.

BRIEF DESCRIPTION OF THE DRAWINGS

In the accompanying drawings.

DETAILED DESCRIPTION OF THE INVENTION

Figure 1:
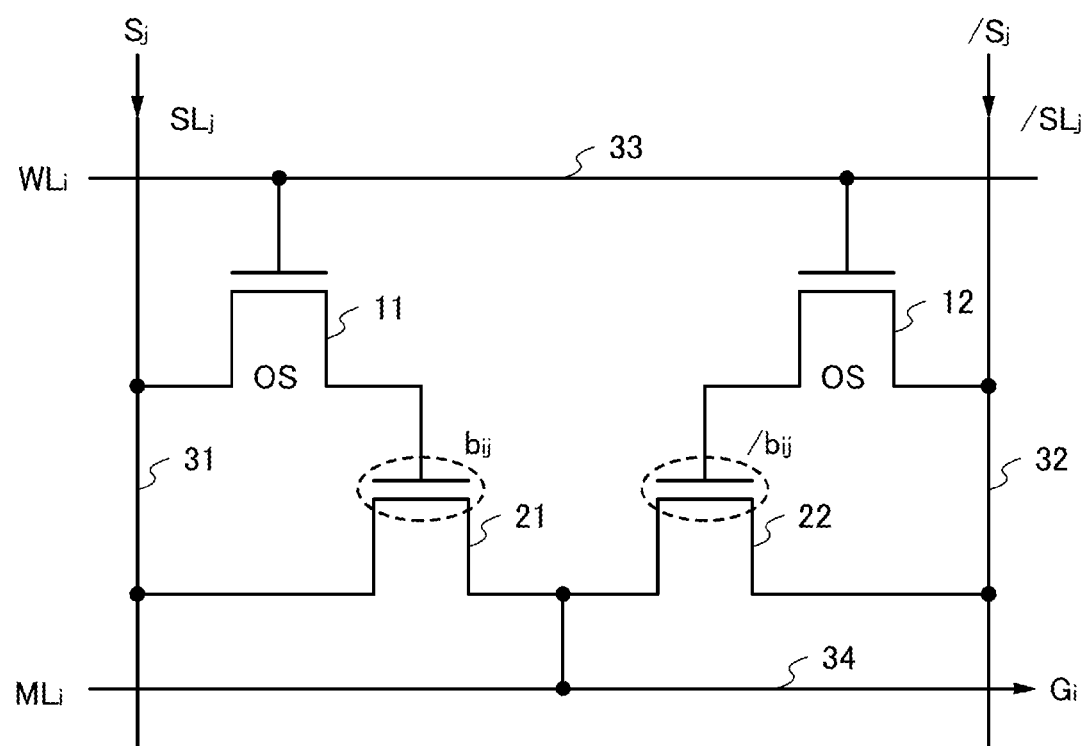
FIG. 1 illustrates an example of a semiconductor device.

Embodiments will be described in detail with reference to the accompanying drawings.

It is easily understood by those skilled in the art that modes and details of the present invention can be changed in various ways without departing from the spirit of the present invention.

Therefore, the present invention should not be interpreted as being limited to what is described in the embodiments below.

In the structures to be given below, the same portions or portions having similar functions are denoted by the same reference numerals in different drawings, and descriptions thereof will not be repeated.

The embodiments given below can be implemented in an appropriate combination.

(Embodiment 1)

An example of a semiconductor device including a CAM will be described with reference to FIG. 1 and FIG. 2.

Figure 2:
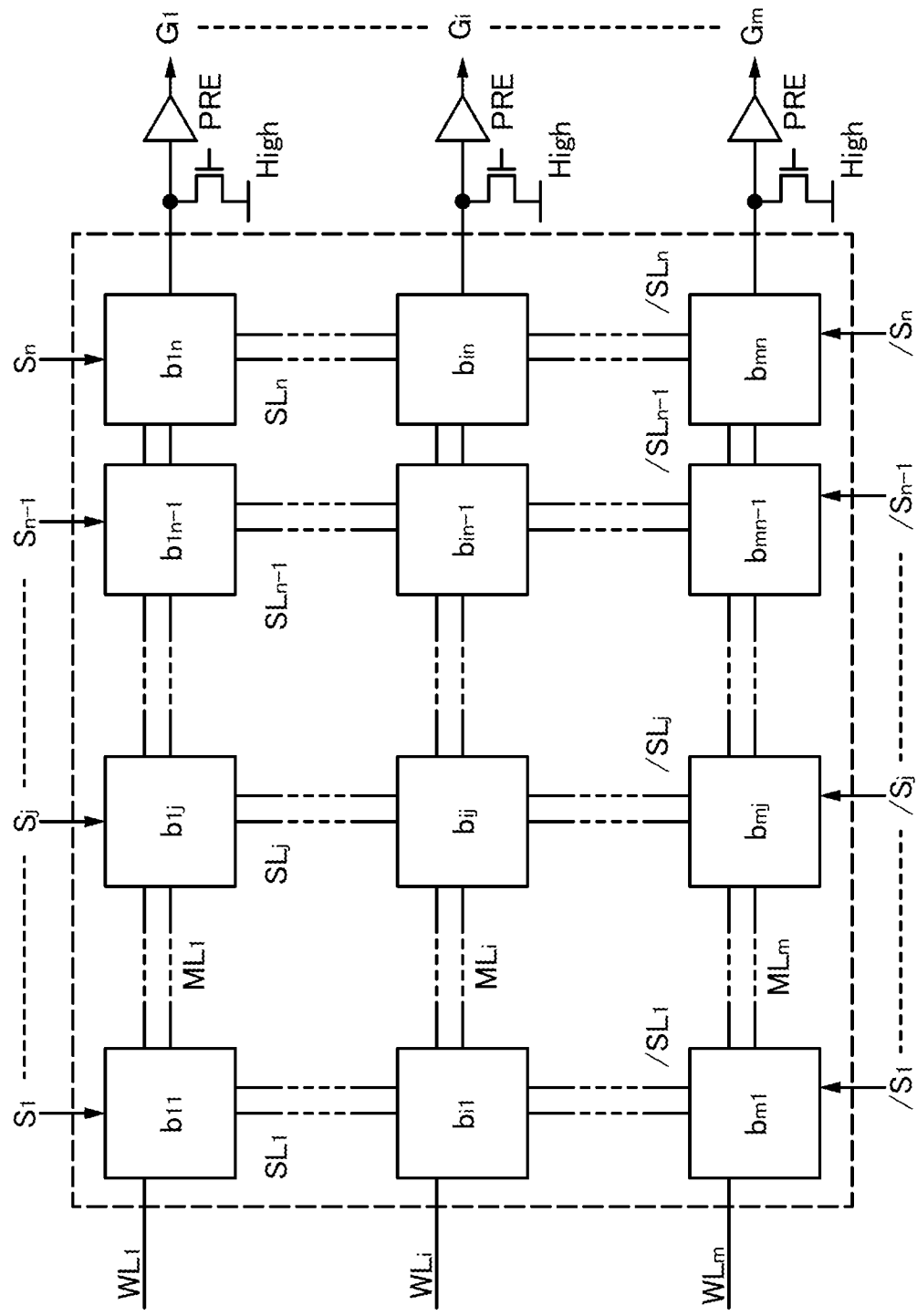
FIG. 2 illustrates an example of a semiconductor device.

FIG. 1 illustrates an example of a memory cell in the i-th row and j-th column (corresponding to $b_{ij}$ in FIG. 2) in FIG. 2. Note that i, j, m, and n in the drawing are natural numbers, and i is smaller than m and j is smaller than n.

In one memory cell of FIG. 1, a transistor 11, a transistor 12, a transistor 21, a transistor 22, a wiring 31, a wiring 32, a wiring 33, and a wiring 34 are arranged.

The transistor 11 and the transistor 12 function as charge supply transistors.

Note that the transistor 11 and the transistor 12 use an oxide semiconductor (OS), which is indicated in the drawing by letter symbols "OS" under circuit symbols of the transistors.

Each of the transistor 21 and the transistor 22 functions as both a reading transistor and a charge storage transistor.

Although the transistor 11, the transistor 12, the transistor 21, and the transistor 22 are n-channel transistors in FIG. 1, they may be p-channel transistors.

Note that in the case of using p-channel transistors, the polarities of input signals or input voltages are inverted as needed.

The wiring 31 and the wiring 32 function as search lines. In the drawing, SL and /SL denote the search lines.

In addition, $SL_x$ (x is an arbitrary number) denotes a search line SL arranged in the memory cell in the x-th column.

The wiring 33 functions as a word line.

In the drawing, WL denotes the word line.

In addition, $WL_y$ (y is an arbitrary number) denotes a word line WL arranged in the memory cell in the y-th row.

The wiring 34 functions as a match line.

In the drawing, ML denotes the match line.

In addition, $ML_y$ (y is an arbitrary number) denotes a match line ML arranged in the memory cell in the y-th row.

The wiring 31 is electrically connected to one of a source and a drain of the transistor 11 and one of a source and a drain of the transistor 21.

The wiring 32 is electrically connected to one of a source and a drain of the transistor 12 and one of a source and a drain of the transistor 22.

The wiring 33 is electrically connected to a gate of the transistor 11 and a gate of the transistor 12.

Note that the gate of the transistor 11 and the gate of the transistor 12 may be electrically connected to different wirings.

However, for inputting the same signal to the gate of the transistor 11 and the gate of the transistor 12, the gate of the transistor 11 and the gate of the transistor 12 are preferably electrically connected to a common wiring as illustrated in FIG. 1.

The wiring 34 is electrically connected to the other of the source and the drain of the transistor 21 and the other of the source and the drain of the transistor 22.

The wiring 31 and the wiring 32 are provided common to a group of memory cells arranged in a column.

The wiring 33 and the wiring 34 are provided common to a group of memory cells arranged in a row.

A gate of the transistor 21 is electrically connected to the other of the source and the drain of the transistor 11.

A gate of the transistor 22 is electrically connected to the other of the source and the drain of the transistor 12.

In this specification, "electrically connected" means being directly connected or being connected through an element that does not affect circuit operation.

The element that does not affect circuit operation refers to an element that, in the case where input is a signal, outputs the signal without changing the content of the signal and, in the case where input is voltage, outputs the voltage without changing the polarity of the voltage, and specifically refers to a resistor, a switch, a diode, and the like. As the switch, a transistor can be given for example. In the case where the input is voltage, a capacitor is also included in examples of the element that does not affect circuit operation.

In FIG. 2, memory cells (referred to as $b_{xy}$) are arranged in an array of rows and columns.

In addition, $b_{xy}$ (x and y are arbitrary numbers) denotes a memory cell arranged in the x-th column and the y-th row.

In FIG. 2, elements that precharge corresponding rows (transistors to or from which "High(1)" is input or output in FIG. 2) and buffers that adjust outputs in the corresponding rows are provided.

An output $G_y$ is input to a determination circuit. In accordance with the output $G_y$ ("High(1)" or "Low(0)"), the determination circuit determines if there is a match.

Here, operations (writing operation, reading operation) will be described.

Operations in the memory cell in the i-th row and j-th column in FIG. 1 and FIG. 2 will be described below as an example. By carrying out the same operations in the other memory cells, writing operation and reading operation in all memory cells can be achieved.

In writing operation, first, a word line $WL_i$ is selected to make the gate of the transistor 11 and the gate of the transistor 12 be in an open state (to make the transistors be in an on state).

Then, a voltage corresponding to "High(1)" or "Low(0)" is input to a search line $SL_j$ and a search line $/SL_j$.

In the case of a ternary CAM (TCAM), the combination of an input $S_j$ of the search line $SL_j$ and an input $/S_j$ of the search line $/SL_j$ has three states, which are a first state where $S_j$ is "High(1)" and $/S_j$ is "Low(0)"; a second state where $S_j$ is "Low(0)" and $/S_j$ is "High(1)"; and a third state where $S_j$ is "Low(0)" and $/S_j$ is "Low(0)".

Note that "High(1)" is a power supply voltage Vdd.

Further, "Low(0)" is a low power supply voltage Vss or a ground potential GND.

The low power supply voltage Vss is a voltage lower than the power supply voltage Vdd.

When a reference potential is not a ground potential GND, a power supply voltage paired with the power supply voltage Vdd is called a low power supply voltage Vss.

The polarities of $S_j$ and $/S_j$ are inverted between the first state and the second state.

In the first state, $S_j$ of "High(1)" is input; accordingly, the memory cell $b_{ij}$ is in the state of "High(1)".

In the second state, $S_j$ of "Low(0)" is input; accordingly, the memory cell $b_{ij}$ is in the state of "Low(0)".

In the third state, $S_j$ of "Low(0)" and $/S_j$ of "Low(0)" are input; accordingly, the memory cell $b_{ij}$ is in the state of "X (Don't Care)".

Data $b_{ij}$ and data $/b_{ij}$ are each stored in a memory cell $b_{ij}$.

Note that $b_{ij}$ is data stored in a channel capacitance in the transistor 21, and $/b_{ij}$ is data stored in a channel capacitance in the transistor 22.

"X (Don't Care)" is a value which will match any input value in reading operation.

The above-described operation is carried out in the same manner in each memory cell; thus writing to each memory cell is completed.

After the writing operation, the gate of the transistor 11 and the gate of the transistor 12 are made to be in a closed state (the transistors are made to be in an off state).

In reading operation, the gate of the transistor 11 and the gate of the transistor 12 are made to be in a closed state (the transistors are made to be in an off state).

In the reading operation, the match line $ML_i$ is precharged with "High(1)".

Then, a voltage corresponding to "High(1)" or "Low(0)" is input to the search line $SL_j$ and the search line $/SL_j$.

In the reading operation, the input $S_j$ of the search line $SL_j$ and the input $/S_j$ of the search line $/SL_j$ have inverted polarities.

Table 1 shows a relationship among $b_{ij}$, $/b_{ij}$, $S_j$, $/S_j$, and $ML_i$ in the reading operation.

TABLE 1

| State | $b_{ij}$ | $/b_{ij}$ | $S_j$ | $/S_j$ | $ML_i$ | Result |
|---|---|---|---|---|---|---|
| First State | 1 | 0 | 1 | 0 | 1 | Match |
| (High) |   |   | 0 | 1 | 0 | Not match |
| Second State | 0 | 1 | 1 | 0 | 0 | Not match |
| (Low) |   |   | 0 | 1 | 1 | Match |
| Third State | 0 | 0 | 1 | 0 | 1 | Match |
| (X) |   |   | 0 | 1 | 1 | Match |

X: Don't Care

As shown in Table 1, in the case where writing operation is carried out in the first state or the second state and further the input $S_j$ matches $b_{ij}$ in the memory cell, the potential of the match line $ML_i$ remains "High(1)".

On the other hand, when the input $S_j$ does not match $b_{ij}$ in the memory cell in the case where writing operation is carried out in the first state or the second state, the potential of the match line $ML_i$ is changed to "Low(0)".

In the case where writing operation is carried out in the third state ("X (Don't Care)"), the gate of the transistor 21 and the gate of the transistor 22 are in a closed state (the transistors are in an off state) in reading operation. Accordingly, the input $S_j$ of the search line $SL_j$ and the input/$S_j$ of the search line/$SL_j$ are not supplied to the match line $ML_i$.

Therefore, in the case where writing operation is carried out in the third state ("X (Don't Care)"), the potential of the match line $ML_i$ remains "High(1)" regardless of whether the input $S_j$ matches with $b_{ij}$ in the memory cell.

Here, the determination circuit which determines the output $G_i$ of the match line $ML_i$ determines that there is a match in the case where the output $G_i$ is "High(1)" and determines that there is not a match in the case where the output $G_i$ is "Low(0)".

In the case where matching occurs in each of all the memory cells in the row, the potential of the match line $ML_i$ remains "High(1)"; consequently, the determination circuit determines that there is a match. That is, in the case where writing operation is carried out in the first state or the second state and further the input $S_j$ matches $b_j$ in all the memory cells in the row or in the case where writing operation is carried out in the third state in all the memory cells in the row, the potential of the match line $ML_i$ remains "High(1)"; consequently, the determination circuit determines that there is a match.

While in the case where matching does not occur in even one memory cell among the memory cells in the row, the potential of the match line $ML_i$ becomes "Low(0)"; consequently, the determination circuit determines that there is not a match. That is, in the case where writing operation is carried out in the first state or the second state and the input $S_j$ does not match $b_j$ in even one memory cell among the memory cells in the row, the potential of the match line $ML_i$ becomes "Low(0)"; consequently, the determination circuit determines that there is not a match.

In the above-described manner, the CAM determines if there is a match for data word on a row basis. When there is a match in even a single row, the CAM as a whole determines that there is a match; while when there is not a match in even a single row, the CAM as a whole determines that there is not a match.

Figure 3:
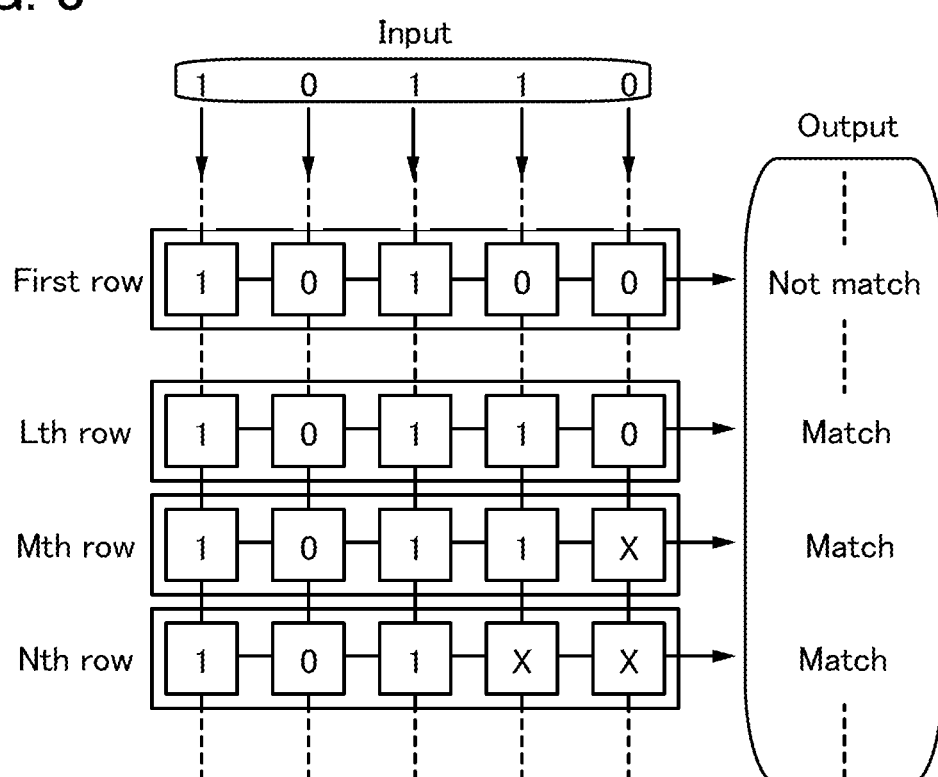
FIG. 3 illustrates an example of a semiconductor device.

For example, as shown in FIG. 3, in the case where a data word "10110" is input, a data word "10100" stored in the first row does not match the input data word "10110", which results in the determination that there is not a match in the first row.

Further in FIG. 3, a data word "10110" is stored in the L-th row and matches the input data word "10110", which results in the determination that there is a match in the L-th row.

Further in FIG. 3, a data word "1011X" is stored in the M-th row. Since X matches any value, the data word "1011X" matches the input data word "10110", which results in the determination that there is a match in the M-th row.

Further in FIG. 3, a data word "101XX" is stored in the N-th row. Since X matches any value, the data word "101XX" matches the input data word "10110", which result in the determination that there is a match in the N-th row.

Thus in FIG. 3, there is a row where matching occurs; accordingly, the CAM as a whole determines that there is a match.

On the other hand, in the case where there is no row where matching occurs, the CAM as a whole determines that there is not a match.

The contents of this embodiment or part thereof can be implemented in combination with any of the other embodiments and example (Embodiment 2)

In the case where writing operation is carried out only in the first state and the second state without storage of "X (Don't Care)" in FIG. 1, FIG. 2, FIG. 4, and FIG. 5, the memory functions as a binary CAM (BCAM).

That is, the configurations illustrated in FIG. 1, FIG. 2, FIG. 4, and FIG. 5 can be utilized in both a binary CAM (BCAM) and a ternary CAM (TCAM).

The contents of this embodiment or part thereof can be implemented in combination with any of the other embodiments and example.

(Embodiment 3)

In a binary CAM (BCAM) and a ternary CAM (TCAM), there is a case in which confirmation of stored data in each memory cell after writing is wanted.

In the case of the BCAM, data words stored in all rows can be confirmed through repetition of reading operation; thus, storage data in each memory cell can be confirmed only by reading operation.

However, in the case of the ternary CAM (TCAM) as in the example illustrated in FIG. 3, there might be plural rows where matching occurs.

When there are plural rows where matching occurs, it is difficult to determine whether "X" is included in the data in the row where matching occurs; therefore, the determination of the storage data in all memory cells cannot be made by repeating reading operation in some cases.

Another memory may be prepared so that written data can be stored in the memory.

However, the method of storing data in another memory would not be a preferred method because it needs to prepare another memory having a large area.

In view of this point, in this embodiment, a configuration with which storage data in each memory cell can be confirmed after writing will be described with reference to FIG. 4 and FIG. 5.

Figure 4:
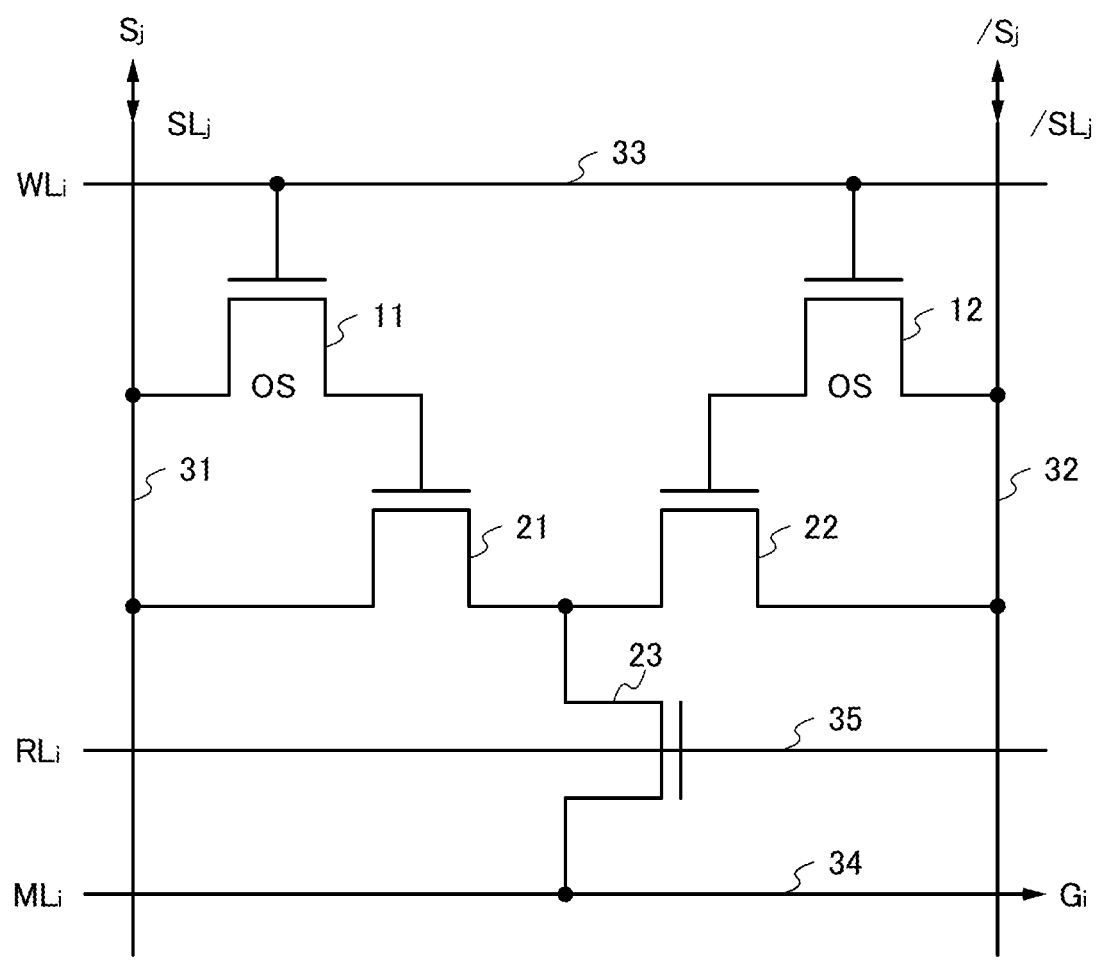
FIG. 4 illustrates an example of a semiconductor device.

The configuration in FIG. 4 is a configuration made by adding a transistor 23 between the wiring 34 that is a match line and a connection portion between the other of the source and the drain of the transistor 21 and the other of the source and the drain of the transistor 22 in FIG. 1.

In FIG. 4, one of a source and a drain of the transistor 23 is electrically connected to the connection portion between the other of the source and the drain of the transistor 21 and the other of the source and the drain of the transistor 22.

In FIG. 4, the other of the source and the drain of the transistor 23 is electrically connected to the wiring 34.

In FIG. 4, a gate of the transistor 23 is electrically connected to a wiring 35.

Note that the transistor 23 is an n-channel transistor in this embodiment but may be a p-channel transistor.

In the case where the transistor 23 is a p-channel transistor, the polarities of input signals or input voltages may be adjusted as needed.

The wiring 35 functions as a reading selection line.

In the drawing, RL denotes the reading selection line.

In addition, $RL_y$ (y is an arbitrary number) denotes a reading selection line RL arranged in the memory cell in the y-th row.

The wiring 35 is provided common to a group of memory cells arranged in a row.

Figure 5:
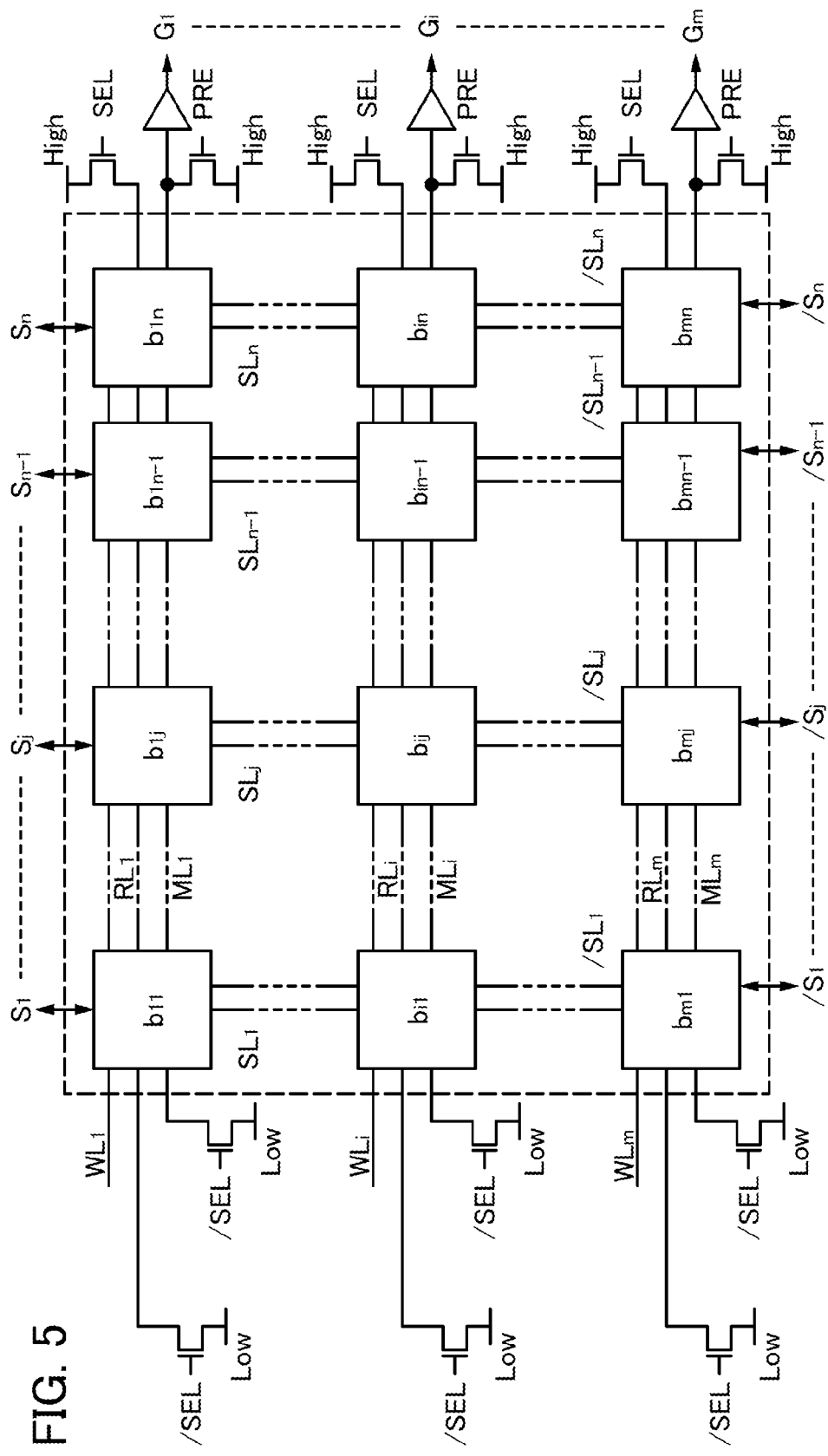
FIG. 5 illustrates an example of a semiconductor device.

The configuration of FIG. 5 is a configuration made by adding a reading selection lines RL, elements that input "High(1)" or "Low(0)" to the reading selection lines RL (e.g., transistors), and elements that input "Low(0)" to the match lines ML (e.g., transistors), to the configuration of FIG. 2.

In this embodiment, addition of the transistor 23 and the reading selection line RL allows confirmation operation, in addition to the writing operation and the reading operation.

The operation in FIG. 4 and FIG. 5 will be described.

Operations in the memory cell in the i-th row and j-th column in FIG. 4 and FIG. 5 will be described below as an example. By carrying out the same operations in the other memory cells, writing operation, reading operation, and confirmation operation in all memory cells can be achieved.

Writing operation is similar to that in FIG. 1 and FIG. 2.

In the writing operation, the transistor 23 may be either in an on state or off state.

Note that the transistor 23 is preferably in an off state in order to prevent an electrical condition of the match line $ML_i$ from affecting the search line $SL_j$ during the writing operation.

The transistor 23 may be added also in Embodiment 1 in which confirmation operation is not carried out, in order to prevent an electrical condition of the match line ML from affecting the search line SL.

Reading operation is also similar to that in FIG. 1 and FIG. 2.

In the reading operation, the match line $ML_i$ needs to be electrically connected to the connection portion between the other of the source and the drain of the transistor 21 and the other of the source and the drain of the transistor 22. Accordingly, the transistor 23 is in an on state during the reading operation.

In the confirmation operation, the search lines $S_1$ to $Sn$ and the search lines $/S_j$ to $/S_n$ are all precharged with "Low (0)".

In the case of reading data in the i-th row, the match line $ML_i$ and the reading selection line $RL_i$ in the i-th row are set to "High(1)", and the match lines $ML_1$ to $ML_{i-1}$ and $ML_{i+1}$ to $ML_m$ and the reading selection lines $RL_1$ to $RL_{i-1}$ and $RL_{i+1}$ to $RL_m$ in the rows other than the i-th row are set to "Low(0)".

At this time, in accordance with $b_{ij}$ stored in the i-th memory cell, the output $S_j$ becomes "High(1)" or "Low(0)".

That is, in the case where $b_{ij}$ is "High(1)", the transistor 21 is in an on state; accordingly, the voltage "High(1)" in the match line $ML_i$ is input to the $SL_j$ and thereby $S_j$ of "High (1)" is output.

On the other hand, in the case where $b_{ij}$ is "Low(0)", the transistor 21 is in an off state; accordingly, the voltage "High(1)" in the match line $ML_i$ is not input to the $SL_j$ and thereby $S_j$ remains in the precharged state of "Low(0)".

At this time, in accordance with/$b_{ij}$ stored in the i-th memory cell, the output/$S_j$ becomes "High(1)" or "Low(0)".

That is, in the case where/$b_{ij}$ is "High(1)", the transistor 22 is in an on state; accordingly, the voltage "High(1)" in the match line $ML_i$ is input to the /$SL_j$ and thereby/$S_j$ of "High (1)" is output.

On the other hand, in the case where/$b_{ij}$ is "Low(0)", the transistor 22 is in an off state; accordingly, the voltage "High(1)" in the match line $ML_i$ is not input to the /$SL_j$ and thereby/$S_j$ remains in the precharged state of "Low(0)".

In the above-described manner, in the confirmation operation, the data $b_{ij}$ can be confirmed by the output $S_j$ and the data/$b_{ij}$ can be confirmed by the output/$S_j$. That is, the storage data in each memory cell can be confirmed by the confirmation operation.

The contents of this embodiment or part thereof can be implemented in combination with any of the other embodiments and example.

(Embodiment 4)

In FIG. 1 and FIG. 4, charge is held (data is stored) with the use of a channel capacitance, which leads to a reduction in the area of one memory cell.

Alternatively, the following configuration may be employed: one electrode of a first capacitor is electrically connected to the gate of the transistor 21, the other electrode of the first capacitor is set to "Low(0)", one electrode of a second capacitor is electrically connected to the gate of the transistor 22, and the other electrode of the second capacitor is set to "Low(0)".

In the above-described configuration, the first capacitor and the second capacitor need to be provided. However, since an oxide semiconductor is used as the semiconductor in the transistor 11 and the transistor 12, even the first capacitor and the second capacitor having small areas can hold charge.

Thus, even in the case where the first capacitor and the second capacitor are provided, the area of the first capacitor and the second capacitor can be minimized; accordingly, the area of one memory cell can be reduced.

The contents of this embodiment or part thereof can be implemented in combination with any of the other embodiments and example.

(Embodiment 5)

In FIG. 1 and FIG. 4, the semiconductor used in the reading and charge storage transistors (the transistor 21, the transistor 22) is preferably a semiconductor having crystallinity and containing silicon for increasing reading speed.

In the case where the amounts of leakage of the charge supply transistors (the transistor 11, the transistor 12) are large, the channel capacitances in the reading and charge storage transistors have to be increased and accordingly the areas of the channel formation regions of the reading and charge storage transistors need to be increased.

For this reason, it is preferable to use an oxide semiconductor in the charge supply transistors (the transistor 11, the transistor 12).

An oxide semiconductor has a wider bandgap than silicon, and the amount of leakage between a source and a drain (the off-state current) of a transistor that uses an oxide semiconductor is significantly smaller than that of a transistor that uses silicon.

In the case of using an oxide semiconductor as the semiconductor used in the charge supply transistors (the transistor 11, the transistor 12), the areas of the channel formation regions of the reading and charge storage transistors can be reduced.

For increasing reading speed, the reading and charge storage transistors (the transistor 21, the transistor 22) need to quickly change the precharged potential in the match line ML (the wiring 34).

Therefore, the channel widths of the reading and charge storage transistors (the transistor 21, the transistor 22) are preferably large.

In contrast, the channel widths of the charge supply transistors (the transistor 11, the transistor 12) are preferably small for achieving small off-state current.

Thus, the channel widths of the reading and charge storage transistors (the transistor 21, the transistor 22) are preferably larger than those of the charge supply transistors (the transistor 11, the transistor 12).

The contents of this embodiment or part thereof can be implemented in combination with any of the other embodiments and example.

(Embodiment 6)

In this embodiment, the oxide semiconductor will be described.

As the semiconductor having crystallinity and containing silicon, there are silicon (Si), silicon germanium (SiGe), and the like.

The semiconductor containing silicon may be anything as long as having crystallinity such as single crystallinity, polycrystallinity, or microcrystallinity; however, the semiconductor containing silicon is preferably single crystal for improving mobility.

The oxide semiconductor preferably contains at least indium (In) or zinc (Zn). In particular, the oxide semiconductor preferably contains In and Zn.

In addition, as a stabilizer for reducing variation in electrical characteristics of a transistor including the oxide semiconductor, it is preferable that one or more elements selected from gallium (Ga), tin (Sn), hafnium (Hf), aluminum (Al), and lanthanoid be contained.

As lanthanoid, there are lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As a single-component metal oxide semiconductor, for example, an indium oxide, a tin oxide, a zinc oxide, or the like can be used.

As a two-component metal oxide semiconductor, for example, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, or the like can be used.

As a three-component metal oxide semiconductor, for example, an In—Ga—Zn-based oxide (also referred to as IGZO), an In—Sn—Zn-based oxide, a Sn—Ga—Zn-based oxide, an In—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an Al—Ga—Zn-based oxide, a Sn—Al—Zn-based oxide, or the like can be used.

As a four-component metal oxide semiconductor, for example, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, or the like can be used.

Note that here for example, an In—Ga—Zn-based oxide refers to an oxide mainly containing In, Ga, and Zn, and there is no limitation on the ratio of In to Ga and Zn. The In—Ga—Zn-based oxide may contain a metal element other than In, Ga, and Zn.

For example, it is possible to use an In—Ga—Zn-based oxide with an atomic ratio of In:Ga:Zn=1:1:1 (1/3:1/3:1/3) or In:Ga:Zn=2:2:1 (=2/5:2/5:1/5), or any of oxides whose composition is in the neighborhood of the above compositions.

Alternatively, it is possible to use an In—Sn—Zn-based oxide with an atomic ratio of In:Sn:Zn=1:1:1 (=1/3:1/3:1/3), In:Sn:Zn=2:1:3 (=1/3:1/6 1/2), or In:Sn:Zn=2:1:5 (=1/4:1/8:5/8), or any of oxides whose composition is in the neighborhood of the above compositions.

Without limitation to the materials given above, a material with an appropriate composition may be used depending on needed semiconductor characteristics (e.g., mobility, threshold voltage, and variation). In order to obtain the needed semiconductor characteristics, an oxide semiconductor preferably has appropriate carrier concentration, impurity concentration, defect density, atomic ratio between a metal element and oxygen, interatomic distance, density, and the like.

The oxide semiconductor may be either single crystal or non-single-crystal.

In the case where the oxide semiconductor is non-single-crystal, the oxide semiconductor may be either amorphous or polycrystalline. Further, the oxide semiconductor may have a structure including a crystalline portion in an amorphous portion. Note that a non-amorphous structure is preferred since an amorphous structure has many defects.

The contents of this embodiment or part thereof can be implemented in combination with any of the other embodiments and example.

(Embodiment 7)

An example of a method for manufacturing a semiconductor device including a CAM will be described with reference to FIGS. 6A to 6C, FIGS. 7A to 7C, FIGS. 8A to 8C, FIGS. 9A to 9C, FIGS. 10A and 10B, FIGS. 11A and 11B, FIG. 12, FIG. 13, FIGS. 14A to 14C, and FIGS. 15A to 15C.

FIGS. 10A and 10B, FIGS. 11A and 11B, and FIG. 12, and FIG. 13 are top views corresponding to FIG. 1 and FIG. 2 and each illustrate four memory cells.

FIGS. 14A to 14C and FIGS. 15A to 15C are top views corresponding to FIG. 4 and FIG. 5 and each illustrate one memory cell.

FIGS. 6A to 6C, FIGS. 7A to 7C, FIGS. 8A to 8C, and FIGS. 9A to 9C correspond to cross-sectional views taken along line A-B in FIGS. 10A and 10B, FIGS. 11A and 11B, FIG. 12, FIG. 13, FIGS. 14A to 14C, and FIGS. 15A to 15C.

The same reference numerals are commonly given to the same portions or portions having similar functions among FIGS. 6A to 6C, FIGS. 7A to 7C, FIGS. 8A to 8C, FIGS. 9A to 9C, FIGS. 10A and 10B, FIGS. 11A and 11B, FIG. 12, FIG. 13, FIGS. 14A to 14C, and FIGS. 15A to 15C.

Figure 6A:
FIGS. 6A to 6C illustrate an example of a method for manufacturing a semiconductor device.

First, a structure body including a substrate 101, an insulating layer 102 over the substrate 101, and a semiconductor layer 200 over the insulating layer 102 is prepared (FIG. 6A).

As the structure body in FIG. 6A, a semiconductor on insulator (SOI) substrate or the like can be used.

Alternatively, the structure body in FIG. 6A may be formed by sequentially forming the insulating layer 102 and the semiconductor layer 200 over the substrate 101.

The base substrate 101 can be, but not limited to, a silicon wafer, a glass substrate, a quartz substrate, or a metal substrate (a stainless-steel substrate or the like).

Instead of the structure body in FIG. 6A, a silicon wafer may be used in formation of transistors.

As the insulating layer 102, any material having an insulating property can be used. For example, a silicon oxide film, a silicon nitride film, a silicon oxide film containing nitrogen, a silicon nitride film containing oxygen, an aluminum nitride film, an aluminum oxide film, a hafnium oxide film, or the like can be used, but the insulating layer 102 is not limited to these examples. The insulating layer 102 may have a single-layer structure or a stacked-layer structure.

The semiconductor layer 200 preferably includes, but not limited to, a semiconductor having crystallinity and containing silicon. For example, a crystalline or amorphous oxide semiconductor may be used. Alternatively, a semiconductor containing amorphous silicon may be used.

As the semiconductor containing silicon, silicon (Si), silicon germanium (SiGe), and the like can be given.

The semiconductor containing silicon may be anything as long as having crystallinity such as single crystallinity, polycrystallinity, or microcrystallinity; however, the semiconductor containing silicon is preferably single crystal for improving mobility.

Figure 6B:
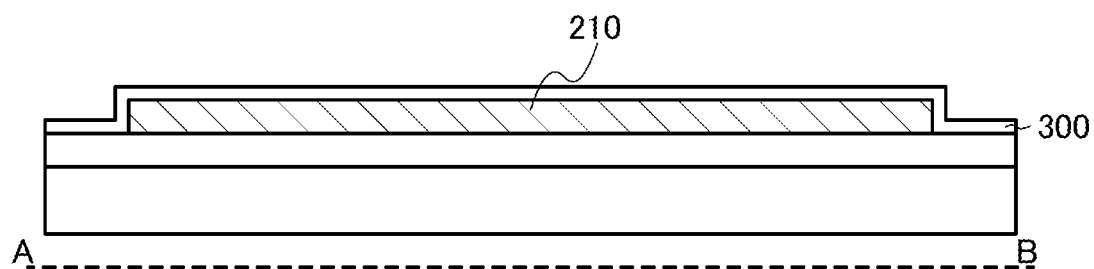
Figure 10A:
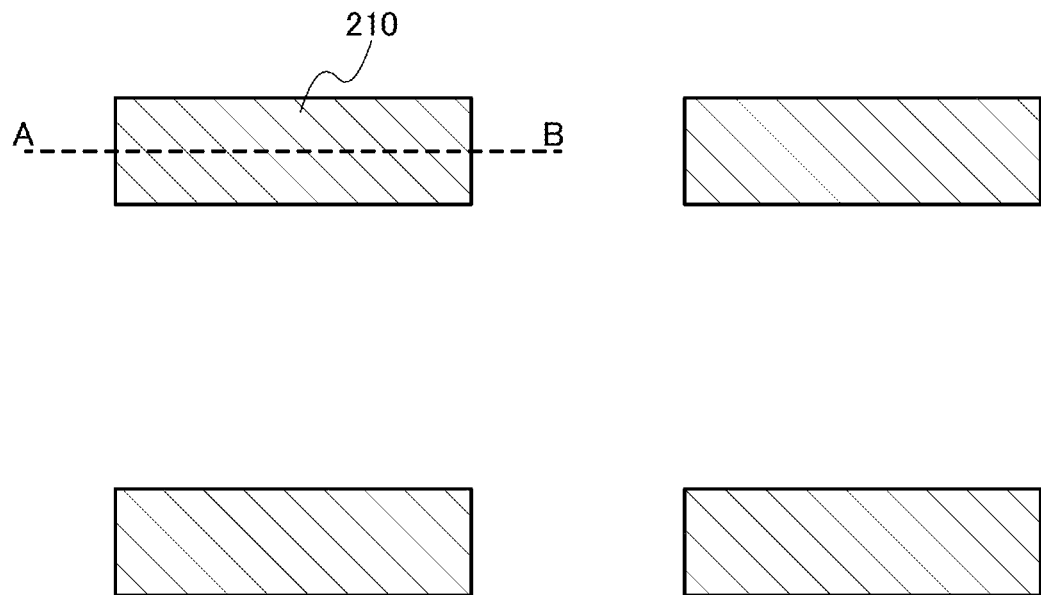
FIGS. 10A and 10B illustrate an example of a method for manufacturing a semiconductor device.
Figure 14A:
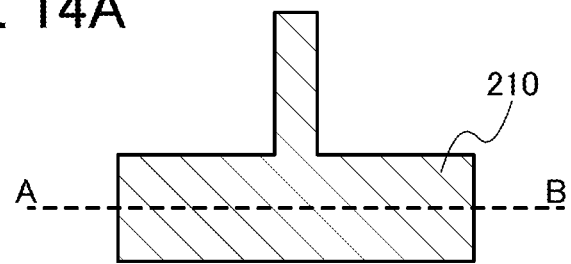
FIGS. 14A to 14C illustrate an example of a method for manufacturing a semiconductor device.

Next, the semiconductor layer 200 is etched to form an island-shaped semiconductor layer 210, and a gate insulating layer 300 is formed over the semiconductor layer 210 (FIG. 6B, FIG. 10A, and FIG. 14A).

As the gate insulating layer 300, any material having an insulating property can be used. For example, a silicon oxide film, a silicon nitride film, a silicon oxide film containing nitrogen, a silicon nitride film containing oxygen, an aluminum nitride film, an aluminum oxide film, a film obtained by oxidizing or nitriding the semiconductor layer 210, a hafnium oxide film, or the like can be used, but the gate insulating layer is not limited to these examples. The gate insulating layer 300 may have a single-layer structure or a stacked-layer structure.

In FIG. 6B, the semiconductor layer for the transistor 21 in FIG. 1 and the semiconductor layer for the transistor 22 in FIG. 1 share the same layer (formed integrally).

Formation of the semiconductor layer for the transistor 21 in FIG. 1 and the semiconductor layer for the transistor 22 in FIG. 1 sharing the same layer as illustrated in FIG. 6B enables a reduction in the area of one memory cell in manufacturing the memory cell in FIG. 1.

Note that the semiconductor layer for the transistor 21 and the semiconductor layer for the transistor 22 may be apart from each other.

In FIG. 10A, the semiconductor layer for the transistor 21 in FIG. 4, the semiconductor layer for the transistor 22 in FIG. 4, and the semiconductor layer for the transistor 23 in FIG. 4 share the same layer (formed integrally).

Formation of the semiconductor layer for the transistor 21 in FIG. 4, the semiconductor layer for the transistor 22 in FIG. 4, and the semiconductor layer for the transistor 23 in FIG. 4 sharing the same layer as illustrated in FIG. 10A enables a reduction in the area of one memory cell in manufacturing the memory cell in FIG. 4.

Note that the semiconductor layer for the transistor 21, the semiconductor layer for the transistor 22, and the semiconductor layer for the transistor 23 may be apart from each other.

Figure 6C:
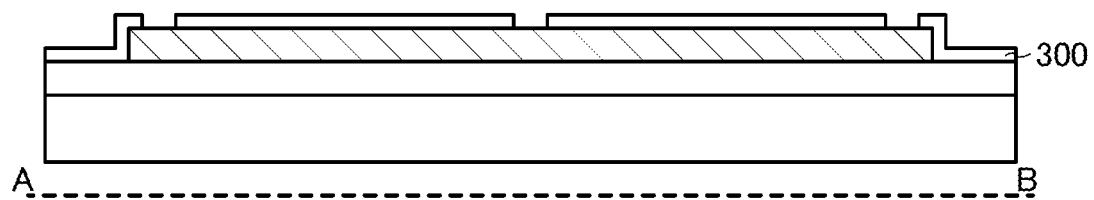

Next, a plurality of openings is provided in the gate insulating layer 300 (FIG. 6C).

The plurality of openings is provided in positions where a source and a drain of transistors are to be formed.

Figure 7A:
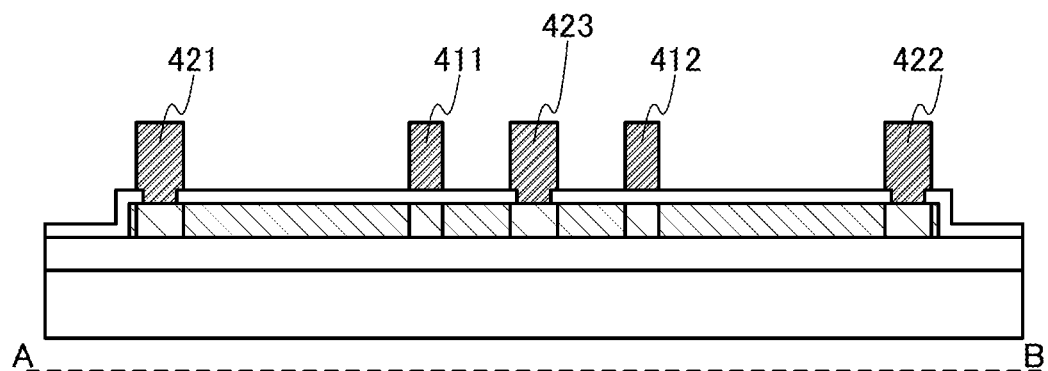
FIGS. 7A to 7C illustrate an example of a method for manufacturing a semiconductor device.
Figure 10B:
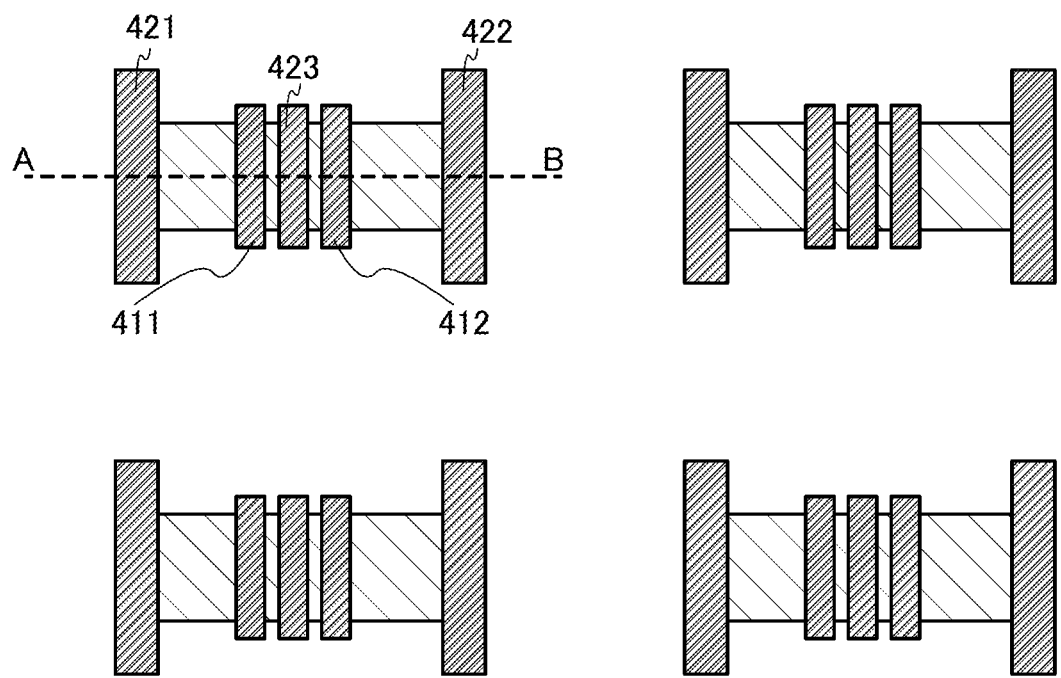
Figure 14B:
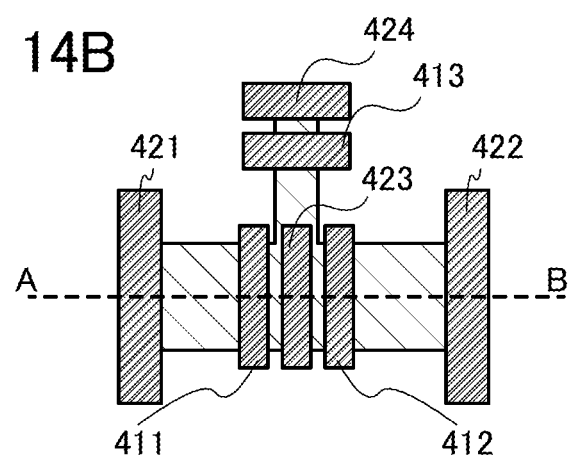

Next, gate electrodes over the gate insulating layer 300 and connection electrodes that are electrically connected to the semiconductor layer 210 through the openings are formed at the same time. Further, an impurity element is added using the gate electrodes and the connection electrodes as masks (FIG. 7A, FIG. 10B, FIG. 14B). Since the gate electrodes and the connection electrodes are formed at the same time in the same step, the gate electrodes and the connection electrodes can be in the same layer. Further, since the gate electrodes and the connection electrodes are formed at the same time in the same step, the gate electrodes and the connection electrodes can be formed using the same starting film.

As the impurity element, a donor element (e.g., phosphorus, arsenic) or an acceptor element (e.g., boron) can be used.

In order to reduce the resistance in portions where the connection electrodes and the semiconductor layer are in contact with each other, an impurity element may be selectively added to the portions in contact with the connection electrodes before formation of the connection electrodes.

Note that an electrode 411, an electrode 412, and an electrode 413 correspond to gate electrodes.

Further, an electrode 421, an electrode 422, an electrode 423, and an electrode 424 correspond to connection electrodes.

The electrode 411 corresponds to the gate electrode of the transistor 21 in FIG. 1 and FIG. 4.

The electrode 412 corresponds to the gate electrode of the transistor 22 in FIG. 1 and FIG. 4.

Furthermore, the electrode 413 corresponds to the gate electrode of the transistor 23 in FIG. 4.

The gate electrodes and the connection electrodes can be formed using any material having a conducting property, which is for example, but not limited to, aluminum, titanium, molybdenum, tungsten, gold, silver, copper, silicon to which an impurity imparting a conductivity type is added, a variety of alloys, an oxide conductive layer (typically, indium tin oxide or the like), or the like. The gate electrodes and the connection electrodes may have a single-layer structure or a stacked-layer structure.

Next, a sidewall insulating layer is formed and subjected to etch back treatment, to form sidewalls 510 on side surfaces of the gate electrodes and side surfaces of the connection electrodes. Then, an impurity element is added using the sidewalls, the gate electrodes, and the connection electrodes as masks (FIG. 7B).

Figure 7B:
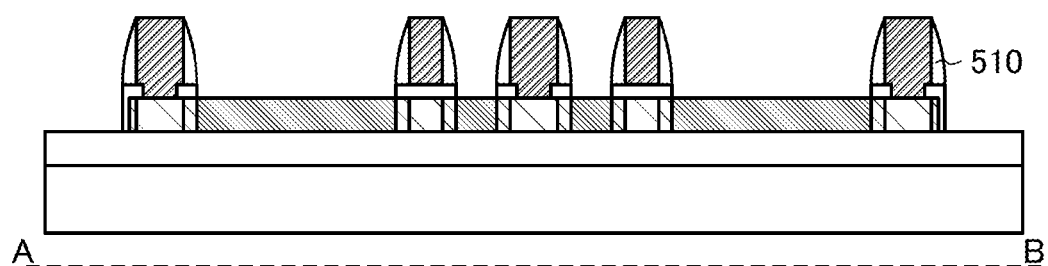

Note that part of the gate insulating layer 300 is removed at the same time as the formation of the sidewalls (FIG. 7B).

The sidewall insulating layer can be formed using any material having an insulating property, which is for example, but not limited to, a silicon oxide film, a silicon nitride film, a silicon oxide film containing nitrogen, a silicon nitride film containing oxygen, an aluminum nitride film, an aluminum oxide film, a hafnium oxide film, or the like. The sidewall insulating layer may have a single-layer structure or a stacked-layer structure.

Figure 7C:
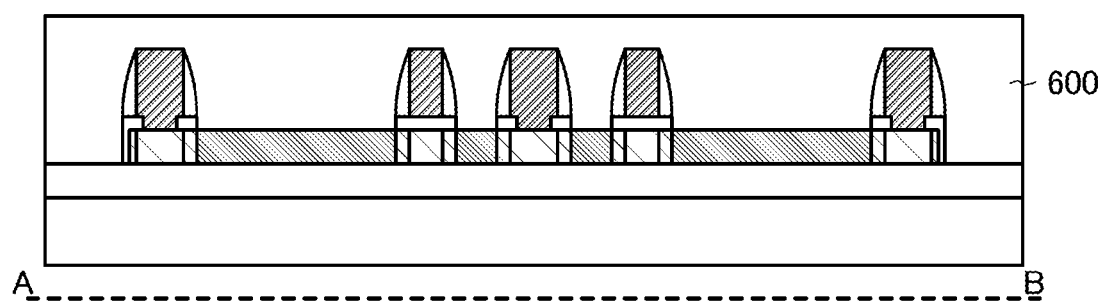

Next, an interlayer insulating film 600 is formed over the gate electrodes and the connection electrodes (FIG. 7C).

The interlayer insulating film 600 can be formed using, but not limited to, a silicon oxide film, a silicon nitride film, a silicon oxide film containing nitrogen, a silicon nitride film containing oxygen, polyimide, an acrylic resin, a siloxane polymer, an aluminum nitride film, an aluminum oxide film, a hafnium oxide film, or the like. The interlayer insulating film 600 may have a single-layer structure or a stacked-layer structure.

Figure 8A:
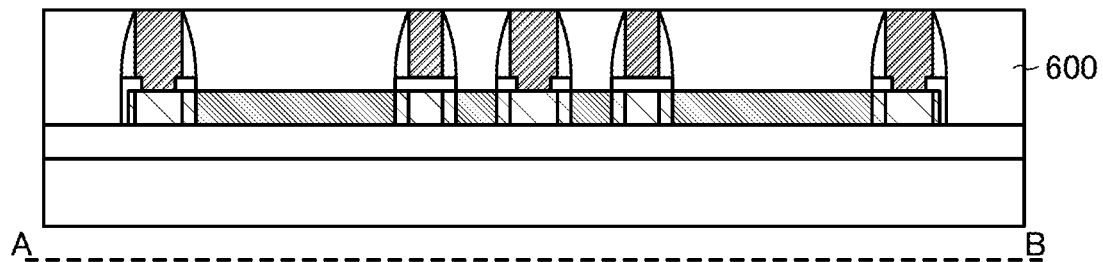
FIGS. 8A to 8C illustrate an example of a method for manufacturing a semiconductor device.

Next, top surfaces (surfaces) of the gate electrodes and the connection electrodes are exposed by performing etch back treatment or polishing (e.g., mechanical polishing, chemical mechanical polishing (CMP)) on the interlayer insulating film 600 (FIG. 8A).

The interlayer insulating film 600 is thus embedded, so that the top surfaces (surfaces) of the gate electrodes and the connection electrodes can be exposed without formation of contact holes, which enables a reduction in the number of masks.

The interlayer insulating film 600 from which the top surfaces (surfaces) of the gate electrodes and the connection electrodes are exposed is in the state of being embedded between the gate electrodes and the connection electrodes.

Therefore, the interlayer insulating film 600 from which the top surfaces (surfaces) of the gate electrodes and the connection electrodes are exposed can be called embedded insulating layer.

In the case where the oxide semiconductor layer formed later is to have crystallinity, the interlayer insulating film 600 over which the oxide semiconductor layer is formed preferably has a highly planar surface.

For this purpose, CMP is preferably employed as a method for exposing the top surface (surfaces) of the gate electrodes and the connection electrodes.

Figure 8B:
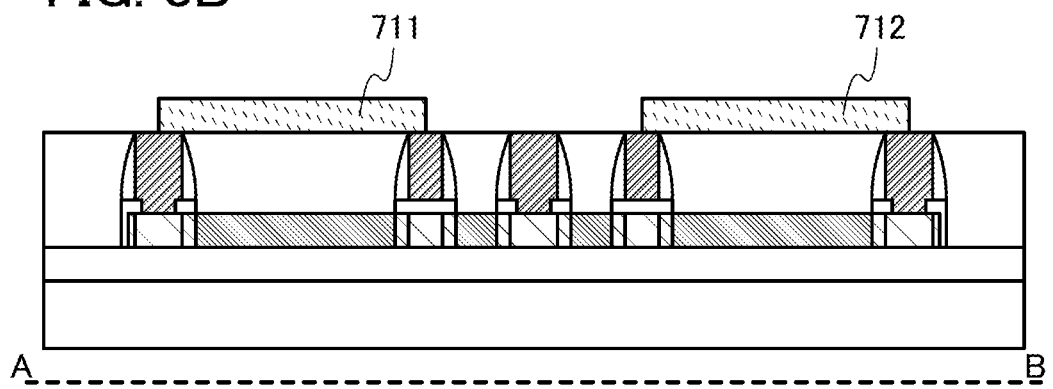
Figure 11A:
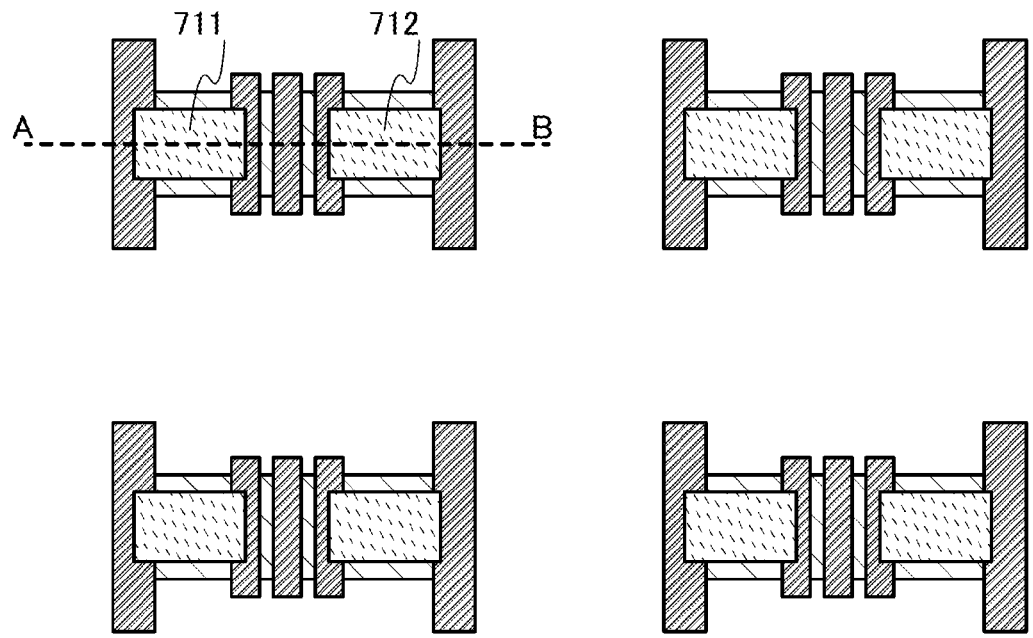
FIGS. 11A and 11B illustrate an example of a method for manufacturing a semiconductor device.
Figure 14C:
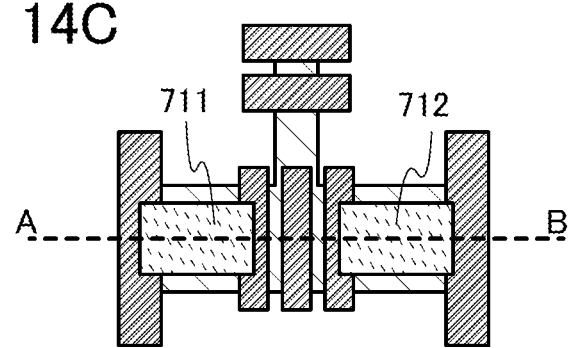

Next, an oxide semiconductor layer 711 and an oxide semiconductor layer 712 are formed over the interlayer insulating film (embedded insulating layer) 600, the connection electrodes, and the gate electrodes (FIG. 8B, FIG. 11A, FIG. 14C).

The oxide semiconductor layer 711 corresponds to the semiconductor layer in the transistor 11 in FIG. 1 and FIG. 4.

Further, the oxide semiconductor layer 712 corresponds to the semiconductor layer in the transistor 12 in FIG. 1 and FIG. 4.

An end portion of each of the oxide semiconductor layers is in contact with the connection electrode, and another end portion of each of the oxide semiconductor layers is in contact with the gate electrode.

The oxide semiconductor layers are each positioned in a region overlapping with a region between the connection electrode and the gate electrode and also in a region overlapping with the lower-layer semiconductor layer.

With the above-described structure, the area of one memory cell can be reduced.

Here, a hydrogen element serves as a carrier (a donor) in an oxide semiconductor layer.

Further, since a hydrogen element has a reducing character, it also serves as an element causing oxygen deficiency.

Because a hydrogen element has the two factors that induce carriers, a substance containing a hydrogen element is a substance which prevents an oxide semiconductor layer from being highly purified so that the oxide semiconductor layer is not close to an i-type oxide semiconductor layer.

Note that examples of the substance containing a hydrogen element, for example, include hydrogen, moisture, hydroxide, hydride, and the like.

If the interlayer insulating film 600 is formed using a plasma CVD method, a hydrogen element contained in a film formation gas is introduced into the interlayer insulating film 600 and adversely affects the oxide semiconductor layers.

A resin film of polyimide, an acrylic resin, a siloxane polymer, or the like contains much moisture and therefore adversely affects the oxide semiconductor layers.

For this reason, the interlayer insulating film 600 in contact with the oxide semiconductor layer 711 and the oxide semiconductor layer 712 is preferably a film that is formed using a sputtering method and does not contain hydrogen. In particular, the interlayer insulating film 600 is preferably a silicon oxide film or an aluminum oxide film formed by a sputtering method.

Figure 8C:
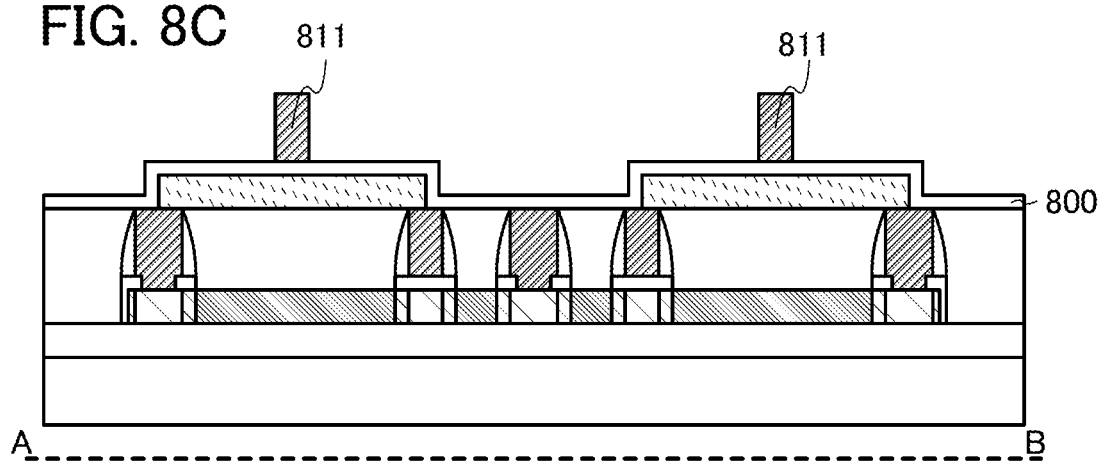
Figure 11B:
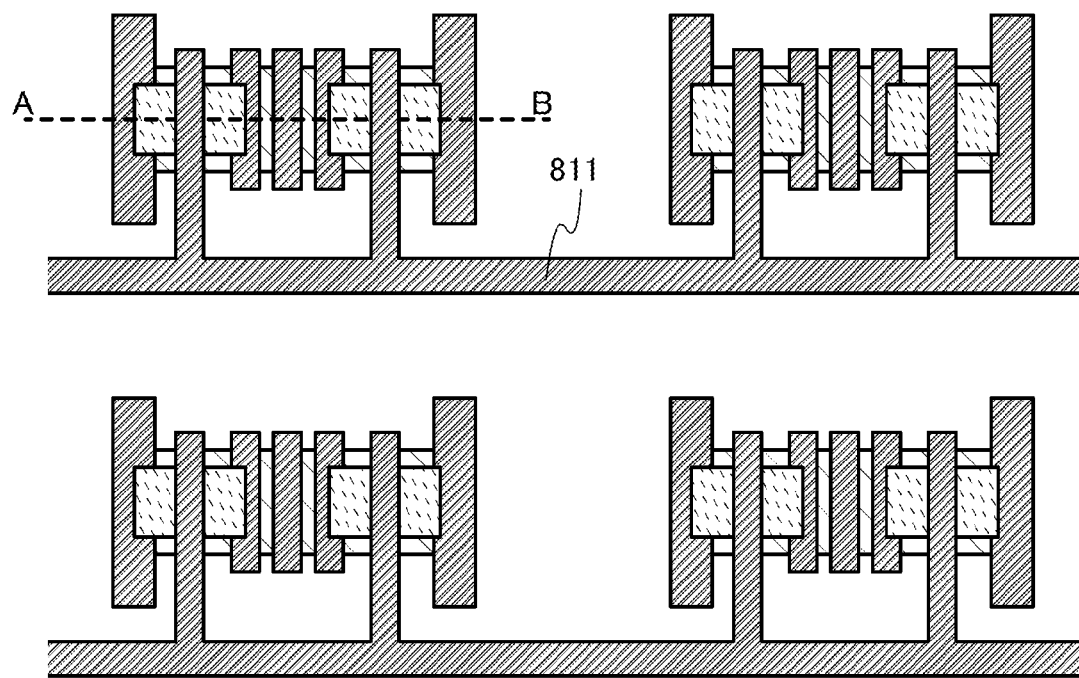
Figure 15A:
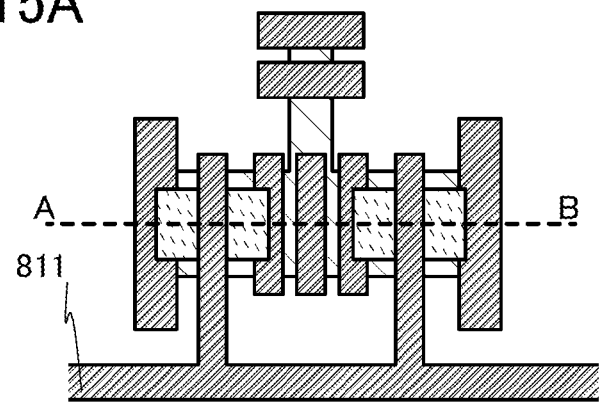
FIGS. 15A to 15C illustrate an example of a method for manufacturing a semiconductor device.

Next, a gate insulating layer 800 is formed over the oxide semiconductor layer 711 and the oxide semiconductor layer 712, and a gate electrode (gate wiring) 811 is formed over the gate insulating layer 800 (FIG. 8C, FIG. 11B, FIG. 15A).

The gate insulating layer 800 can be formed using any material having an insulating property, which is for example, but not limited to, a silicon oxide film, a silicon nitride film, a silicon oxide film containing nitrogen, a silicon nitride film containing oxygen, an aluminum nitride film, an aluminum oxide film, a hafnium oxide film, or the like. The gate insulating layer 800 may have a single-layer structure or a stacked-layer structure.

The gate electrode 811 can be formed using any material having a conducting property, which is for example, but not limited to, aluminum, titanium, molybdenum, tungsten, gold, silver, copper, silicon to which an impurity imparting a conductivity type is added, a variety of alloys, an oxide conductive layer (typically, indium tin oxide or the like), or the like. The gate electrode (gate wiring) may have a single-layer structure or a stacked-layer structure.

The gate electrode 811 corresponds to the gate electrode of the transistor 11, the gate electrode of the transistor 12, and the wiring (word line WL) 33 in FIG. 1 and FIG. 4.

Figure 9A:
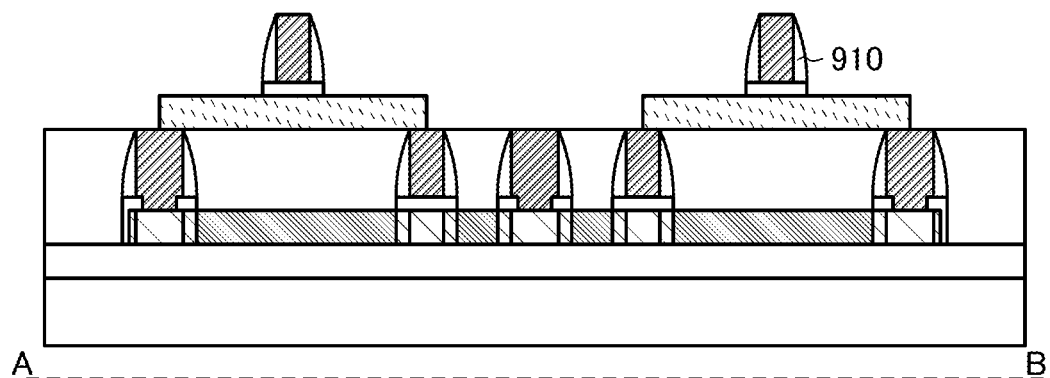
FIGS. 9A to 9C illustrate an example of a method for manufacturing a semiconductor device.

Next, a sidewall insulating layer is formed and subjected to etch back treatment, to form sidewalls 910 on side surfaces of the gate electrodes (FIG. 9A).

Note that part of the gate insulating layer 800 is removed at the same time as the formation of the sidewalls (FIG. 9A).

The sidewall insulating layer can be formed using any material having an insulating property, which is for example, but not limited to, a silicon oxide film, a silicon nitride film, a silicon oxide film containing nitrogen, a silicon nitride film containing oxygen, an aluminum nitride film, an aluminum oxide film, a hafnium oxide film, or the like. The sidewall insulating layer may have a single-layer structure or a stacked-layer structure.

Figure 9B:
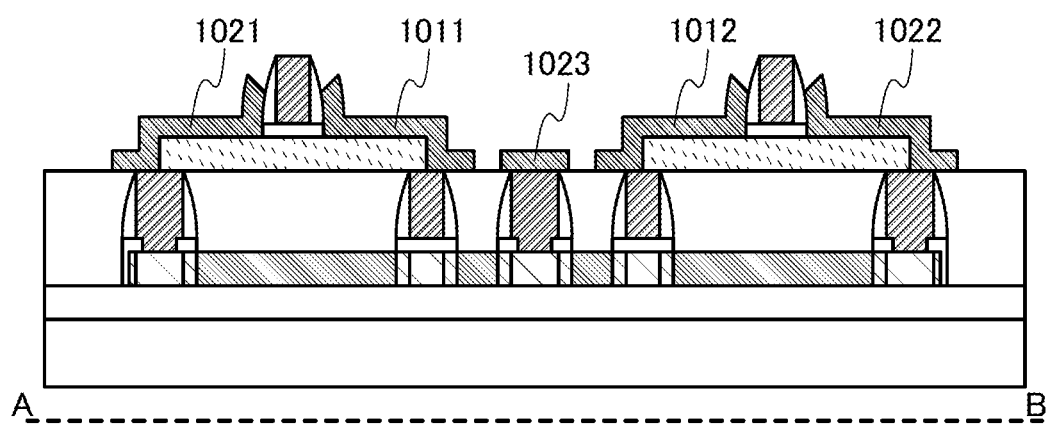
Figure 12:
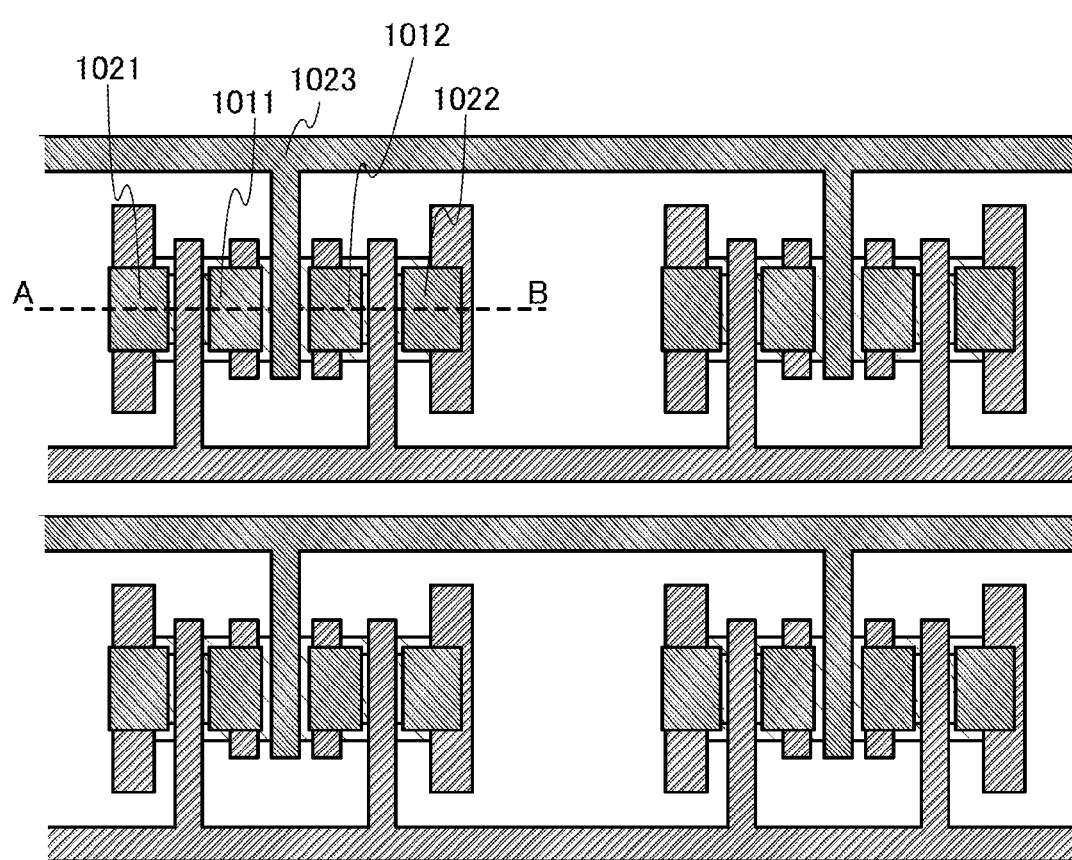
FIG. 12 illustrates an example of a method for manufacturing a semiconductor device.
Figure 15B:
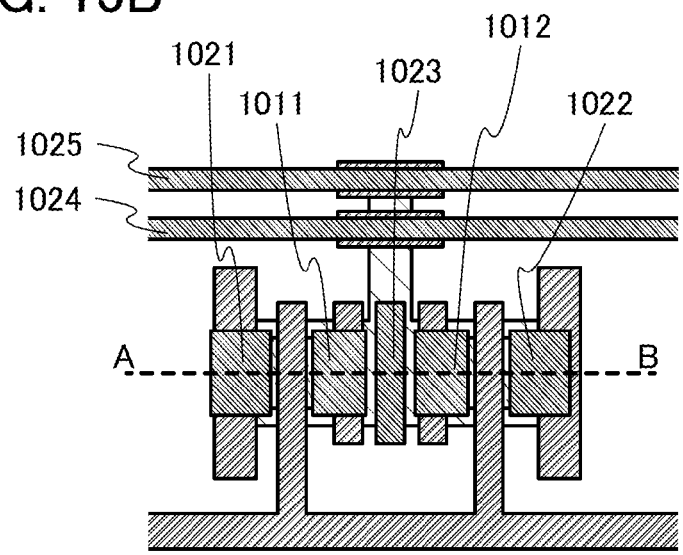

Next, an electrode 1011 and an electrode 1021 over the oxide semiconductor layer 711, an electrode 1012 and an electrode 1022 over the oxide semiconductor layer 712, and a wiring 1023 over the electrode 423 and the interlayer insulating film 600 are formed at the same time (FIG. 9B, FIG. 12, FIG. 15B).

In the case of forming the memory cell in FIG. 4, a wiring 1024 over the electrode 413 and the interlayer insulating film 600 and a wiring 1025 over the electrode 424 and the interlayer insulating film 600 are formed at the same time as illustrated in FIG. 15B.

The electrodes and the wirings in FIG. 9B can be formed using any material having a conducting property, which is for example, but not limited to, aluminum, titanium, molybdenum, tungsten, gold, silver, copper, silicon to which an impurity imparting a conductivity type is added, a variety of alloys, an oxide conductive layer (typically, indium tin oxide or the like), or the like. The electrodes and the wirings may have a single-layer structure or a stacked-layer structure.

One of the electrode 1011 and the electrode 1021 corresponds to the source electrode of the transistor 11 in FIG. 1 and FIG. 4 and the other of the electrode 1011 and the electrode 1021 corresponds to the drain electrode of the transistor 11 in FIG. 1 and FIG. 4.

One of the electrode 1012 and the electrode 1022 corresponds to the source electrode of the transistor 12 in FIG. 1 and FIG. 4 and the other of the electrode 1012 and the electrode 1022 corresponds to the drain electrode of the transistor 12 in FIG. 1 and FIG. 4.

The wiring 1023 corresponds to the wiring (match line ML) 34 in FIG. 1.

The wiring 1023 serves as an auxiliary wiring for the wiring that electrically connects the transistor 23 in FIG. 4 and the transistor 21 and the transistor 22 in FIG. 4. The auxiliary wiring can be omitted; however, the auxiliary wiring is preferably formed because it enables quick supply of charge to the match line ML.

The wiring 1024 corresponds to the wiring (reading selection line RL) 35 in FIG. 4.

The wiring 1025 corresponds to the wiring (match line ML) 34 in FIG. 4.

By making the source and drain electrodes (the electrode 1011, the electrode 1021, the electrode 1012, the electrode 1022, and the like) be in contact with the lower-layer gate electrodes and the lower-layer connection electrodes as illustrated in FIG. 9B, even in the case where a contact failure arises between the oxide semiconductor layers and the lower-layer gate electrodes or the lower-layer connection electrodes, the oxide semiconductor layers can be electrically connected to the lower-layer gate electrodes or the lower-layer connection electrodes.

A region overlapping with the electrode 1011 in the oxide semiconductor layer 711, a region overlapping with the electrode 1021 in the oxide semiconductor layer 711, a region overlapping with the electrode 1012 in the oxide semiconductor layer 712, and a region overlapping with the electrode 1022 in the oxide semiconductor layer 712 can be regarded as source regions and drain region in the respective transistors.

Further, the existence of the sidewalls 510 enables formation of high-resistance regions (regions overlapping with the sidewalls in the oxide semiconductor layers) between the channel formation regions and the source and drain electrodes; accordingly, the off-state current of the transistors including the oxide semiconductor can be reduced. Thus, the amount of leakage of the transistors including the oxide semiconductor can be reduced.

Figure 9C:
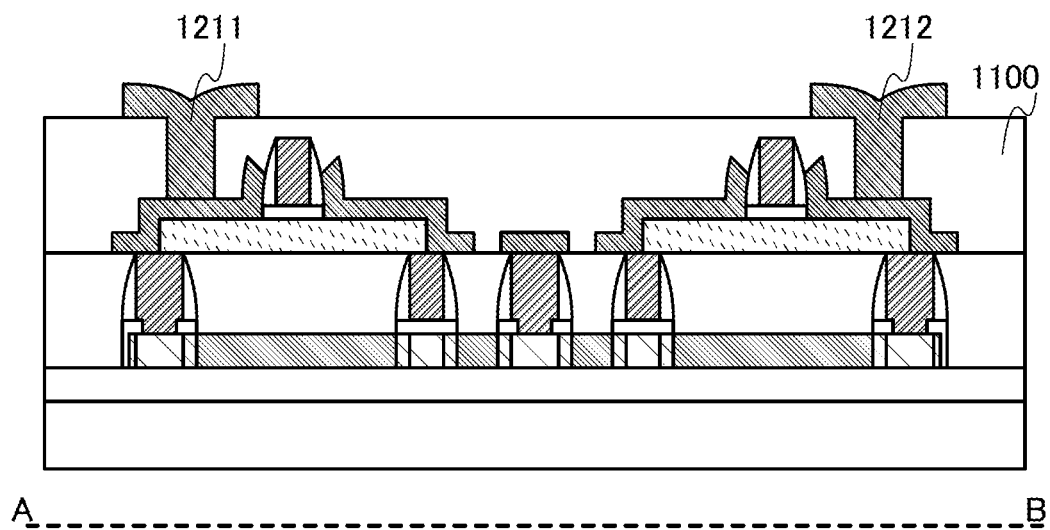
Figure 13:
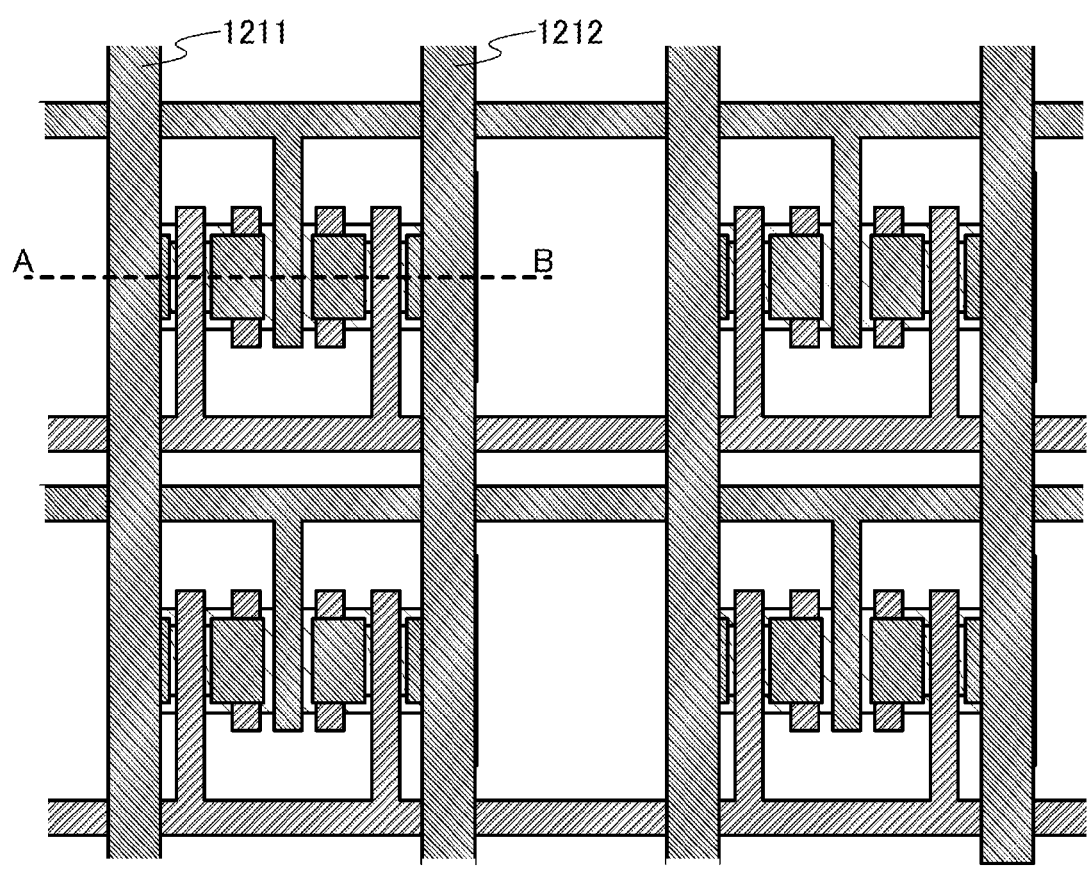
FIG. 13 illustrates an example of a method for manufacturing a semiconductor device.
Figure 15C:
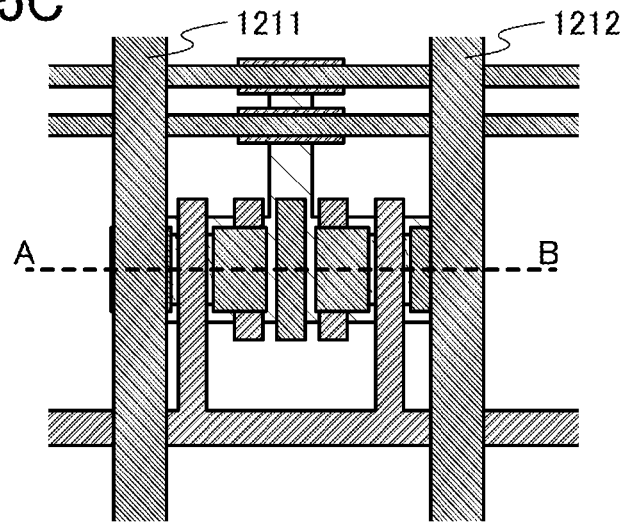

Next, an interlayer insulating film 1100 is formed over the gate electrodes, and contact holes are formed in the interlayer insulating film 1100. Then, a wiring 1211 and a wiring 1212 are formed over the interlayer insulating film 1100 (FIG. 9C, FIG. 13, FIG. 15C).

The wiring 1211 is electrically connected to the electrode 1021 through the contact hole.

The wiring 1212 is electrically connected to the electrode 1022 through the contact hole.

The interlayer insulating film 1100 can be formed using, but not limited to, a silicon oxide film, a silicon nitride film, a silicon oxide film containing nitrogen, a silicon nitride film containing oxygen, polyimide, an acrylic resin, a siloxane polymer, an aluminum nitride film, an aluminum oxide film, a hafnium oxide film, or the like. The interlayer insulating film 1100 may have a single-layer structure or a stacked-layer structure.

The wiring 1211 and the wiring 1212 can be formed using any material having a conducting property, which is for example, but not limited to, aluminum, titanium, molybdenum, tungsten, gold, silver, copper, silicon to which an impurity imparting a conductivity type is added, a variety of alloys, an oxide conductive layer (typically, indium tin oxide or the like), or the like. The wiring 1211 and the wiring 1212 may have a single-layer structure or a stacked-layer structure.

The wiring 1211 corresponds to the wiring (search line SL) 31 in FIG. 1 and FIG. 4.

The wiring 1212 corresponds to the wiring (search line/ SL) 32 in FIG. 1 and FIG. 4.

By thus forming and positioning the layers, the area of one memory cell can be reduced in manufacturing the memory cell in FIG. 1 or FIG. 4.

The contents of this embodiment or part thereof can be implemented in combination with any of the other embodiments and example.

(Embodiment 8)

Although the case of the top-gate transistor has been described in Embodiment 7, a bottom-gate transistor or a fin transistor may be used as well.

A top-gate transistor having a structure different from that described in Embodiment 7 may be used as well.

That is, any transistor structure can be applied.

The contents of this embodiment or part thereof can be implemented in combination with any of the other embodiments and example.

EXAMPLE 1

A transistor including an oxide semiconductor containing In, Sn, and Zn can have favorable characteristics by deposition of the oxide semiconductor while heating a substrate or by heat treatment after deposition of an oxide semiconductor film.

The oxide semiconductor preferably contains 5 atomic % or more of each of In, Sn, and Zn.

By intentionally heating the substrate after the deposition of the oxide semiconductor film containing In, Sn, and Zn, the field-effect mobility of the transistor can be increased.

Moreover, the threshold voltage of an n-channel transistor can be shifted in the positive direction.

The positive shift of the threshold voltage of the n-channel transistor makes the absolute value of a voltage used for keeping the n-channel transistor off to decrease, so that power consumption can be reduced.

Further, the n-channel transistor can become a normally-off transistor by a positive shift of the threshold voltage such that the threshold voltage is 0 V or more.

Characteristics of transistors using an oxide semiconductor containing In, Sn, and Zn will be described below.
(Conditions Common to Samples A to C)

An oxide semiconductor layer was formed over a substrate to have a thickness of 15 nm under the following conditions: a target having a composition ratio of In:Sn:Zn=1:1:1 was used; the gas flow rate was $Ar/O_2=6/9$ sccm; the deposition pressure was 0.4 Pa; and the deposition power was 100 W.

Next, the oxide semiconductor layer was etched in an island shape.

Then, a tungsten layer was deposited over the oxide semiconductor layer to have a thickness of 50 nm and was etched, so that a source electrode and a drain electrode were formed.

Next, a silicon oxynitride film (SiON) was formed as a gate insulating film to have a thickness of 100 nm by plasma-enhanced CVD using silane gas ($SiH_4$) and dinitrogen monoxide ($N_2O$).

Then, a gate electrode was formed in the following manner: a tantalum nitride layer was formed to a thickness of 15 nm; a tungsten layer was formed to a thickness of 135 nm; and the layers were etched.

Further, a silicon oxynitride film (SiON) was formed to a thickness of 300 nm by plasma-enhanced CVD and a polyimide film was formed to a thickness of 1.5 µm, thereby forming an interlayer insulating film.

Next, a pad for measurement was formed in the following manner: a contact hole was formed in the interlayer insulating film; a first titanium film was formed to a thickness of 50 nm; an aluminum film was formed to a thickness of 100 nm; a second titanium film was formed to a thickness of 50 nm; and the films were etched.

In this manner, a semiconductor device having a transistor was fabricated.

(Sample A)

In Sample A, heating was not performed on the substrate during the deposition of the oxide semiconductor layer.

Furthermore, in Sample A, heat treatment was not performed after the deposition of the oxide semiconductor layer and before the etching of the oxide semiconductor layer.

(Sample B)

In Sample B, the oxide semiconductor layer was deposited with the substrate heated at 200° C.

Further, in Sample B, heat treatment was not performed after the deposition of the oxide semiconductor layer and before the etching of the oxide semiconductor layer.

The oxide semiconductor layer was deposited while the substrate was heated in order to remove hydrogen serving as a donor in the oxide semiconductor layer.

(Sample C)

In Sample C, the oxide semiconductor layer was deposited with the substrate heated at 200° C.

Further, in Sample C, after the oxide semiconductor layer was deposited and before the oxide semiconductor layer was etched, heat treatment in a nitrogen atmosphere was performed at 650° C. for 1 hour and then heat treatment in an oxygen atmosphere was performed at 650° C. for 1 hour.

The heat treatment at 650° C. for 1 hour in a nitrogen atmosphere was performed in order to remove hydrogen serving as a donor in the oxide semiconductor layer.

Oxygen is also removed by the heat treatment for removing hydrogen, which serves as a donor in the oxide semiconductor layer, causing oxygen vacancy serving as a carrier in the oxide semiconductor layer.

Hence, heat treatment was performed at 650° C. for 1 hour in an oxygen atmosphere to reduce oxygen vacancy.

(Characteristics of Transistors of Samples A to C)

Figure 16A:
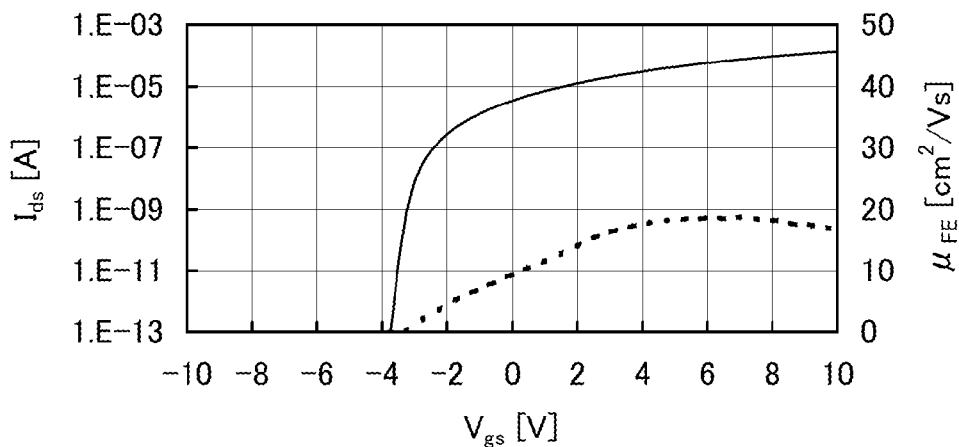
FIGS. 16A to 16C show initial characteristics of samples in Example 1.

FIG. 16A shows initial characteristics of a transistor of Sample A.

Figure 16B:
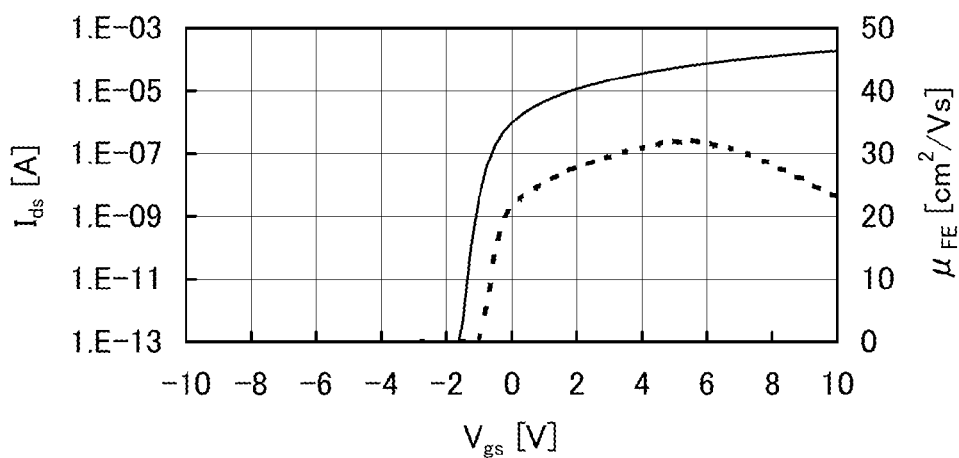

FIG. 16B shows initial characteristics of a transistor of Sample B.

Figure 16C:
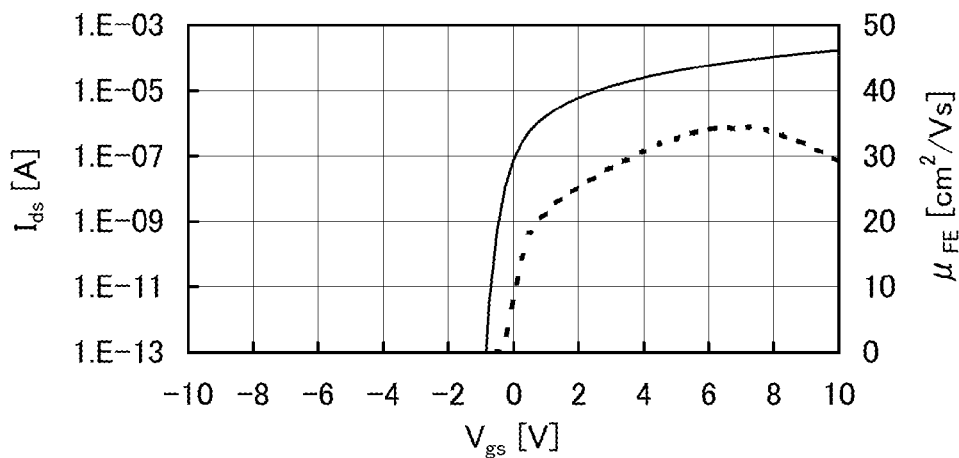

FIG. 16C shows initial characteristics of a transistor of Sample C.

The field-effect mobility of the transistor of Sample A was 18.8 cm$^2$/Vs.

The field-effect mobility of the transistor of Sample B was 32.2 cm$^2$/Vs.

The field-effect mobility of the transistor of Sample C was 34.5 cm$^2$/Vs.

According to observation of cross sections of oxide semiconductor layers, which were formed by deposition methods similar to those of Samples A to C, with a transmission electron microscope (TEM), crystallinity was observed in samples formed by the deposition methods similar to those of Sample B and Sample C, substrates of which were heated during deposition.

Further, surprisingly, the samples, the substrates of which were heated during deposition, had a non-crystalline portion and a crystalline portion having a c-axis crystalline orientation.

In a conventional polycrystal, crystals in the crystalline portion are not aligned and point in different directions. This means that the samples, the substrates of which were heated during deposition, have a novel structure.

Comparison of FIGS. 16A to 16C brings understanding that heat treatment performed on the substrate during or after deposition can remove an hydrogen element serving as a donor, thereby shifting the threshold voltage of the n-channel transistor in the positive direction.

That is, the threshold voltage of Sample B with heating of the substrate during deposition is shifted in the positive direction as compared to the threshold voltage of Sample A without heating of the substrate during deposition.

In addition, it is found from comparison of Sample B and Sample C, the substrates of which were heated during deposition, that the threshold voltage of Sample C with the heat treatment after deposition is more shifted in the positive direction than the threshold voltage of Sample B without the heat treatment after deposition.

As the temperature of heat treatment is higher, a light element such as hydrogen is removed more easily; therefore, hydrogen is more likely to be removed as the temperature of heat treatment is higher.

Accordingly, it is likely that the threshold voltage can be more shifted in the positive direction by further increasing the temperature of the heat treatment during or after deposition.

(Results of Gate BT Stress Tests of Sample B and Sample C)

Gate BT stress tests were performed on Sample B (without heat treatment after deposition) and Sample C (with heat treatment after deposition).

First, the $V_{gs}$-$I_{ds}$ characteristics of each transistor were measured at a substrate temperature of 25° C. and $V_{ds}$ of 10 V to measure the characteristics of the transistor before heating and application of high positive voltage.

Next, the substrate temperature was set to 150° C. and $V_{ds}$ was set to 0.1 V.

After that, $V_{gs}$ of 20 V was applied to the gate insulating film and was kept for 1 hour.

Then, $V_{gs}$ was set to 0 V.

Next, the $V_{gs}$-$I_{ds}$ characteristics of the transistor were measured at a substrate temperature of 25° C. and $V_{ds}$ of 10 V to measure the characteristics of the transistor after heating and application of high positive voltage.

Comparison of the characteristics of the transistor before and after heating and application of high positive voltage as described above is referred to as a positive BT test.

On the other hand, first, the $V_{gs}$-$I_{ds}$ characteristics of each transistor were measured at a substrate temperature of 25° C. and $V_{ds}$ of 10 V to measure the characteristics of the transistor before heating and application of high negative voltage.

Then, the substrate temperature was set to 150° C. and $V_{ds}$ was set to 0.1 V.

Next, $V_{gs}$ of −20 V was applied to the gate insulating film and was kept for 1 hour.

Next, $V_{gs}$ was set to 0 V.

Then, the $V_{gs}$-$I_{ds}$ characteristics of the transistor were measured at a substrate temperature of 25° C. and $V_{ds}$ of 10 V to measure the characteristics of the transistor after heating and application of high negative voltage.

Comparison of the characteristics of the transistor before and after heating and application of high negative voltage as described above is referred to as a negative BT test.

Figure 17A:
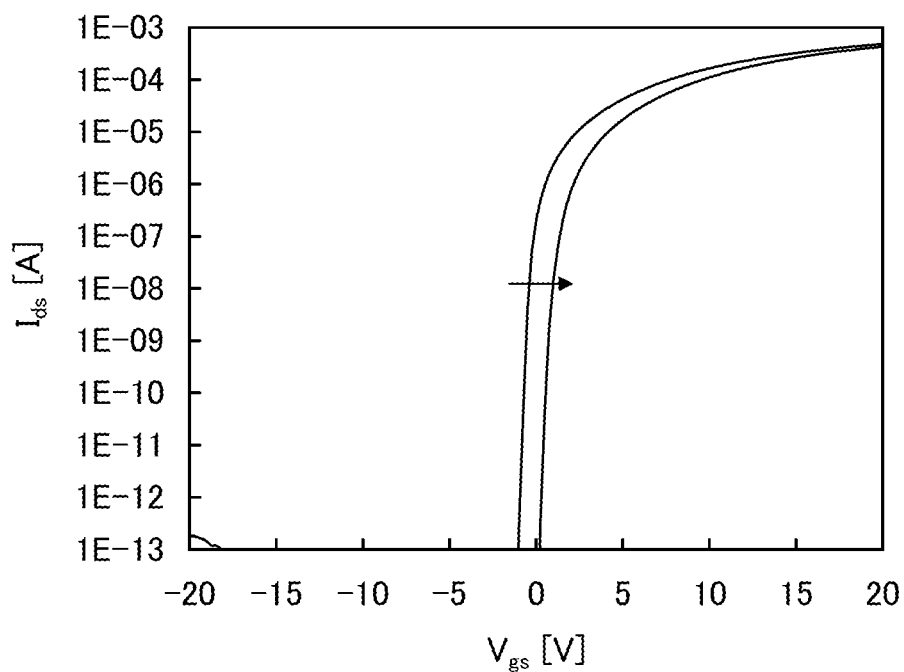
FIGS. 17A and 17B show results of BT tests of a sample in Example 1.
Figure 17B:
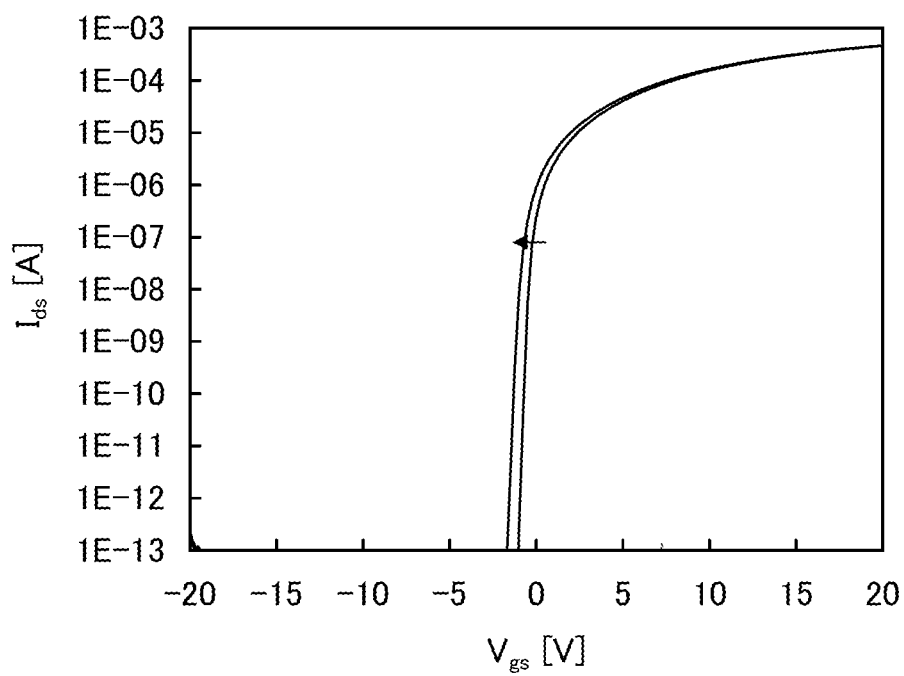

FIG. 17A shows the result of the positive BT test of Sample B. FIG. 17B shows the result of the negative BT test of Sample B.

Figure 18A:
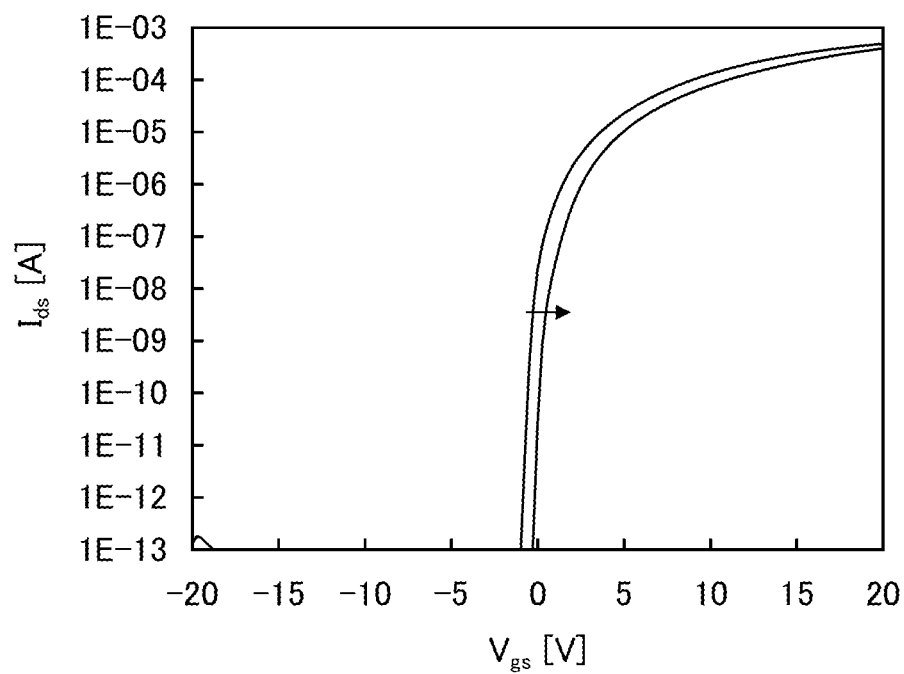
FIGS. 18A and 18B show results of BT tests of a sample in Example 1.
Figure 18B:
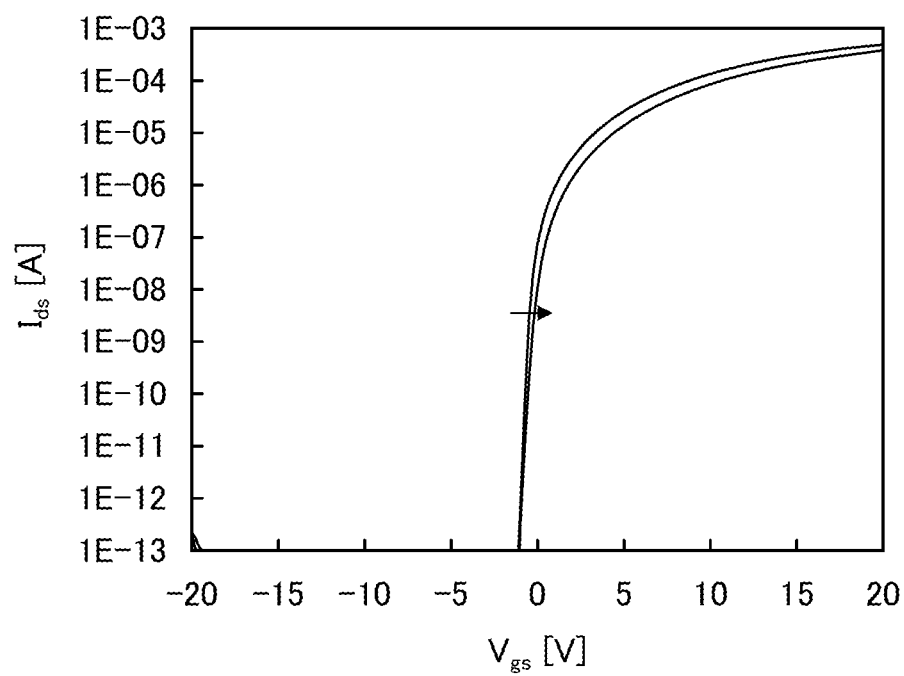

FIG. 18A shows the result of the positive BT test of Sample C. FIG. 18B shows the result of the negative BT test of Sample C.

Although the positive BT test and the negative BT test are tests for determining the deterioration degree of a transistor, it is found from FIG. 17A and FIG. 18A that the threshold voltage can be shifted in the positive direction by performing at least the positive BT test.

In particular, FIG. 17A reveals that the positive BT test made the transistor a normally-off transistor.

Thus, performing the positive BT test in addition to the heat treatment in the fabrication process of the transistor makes it possible to promote a shift of the threshold voltage in the positive direction and consequently a normally-off transistor can be fabricated.

Figure 19:
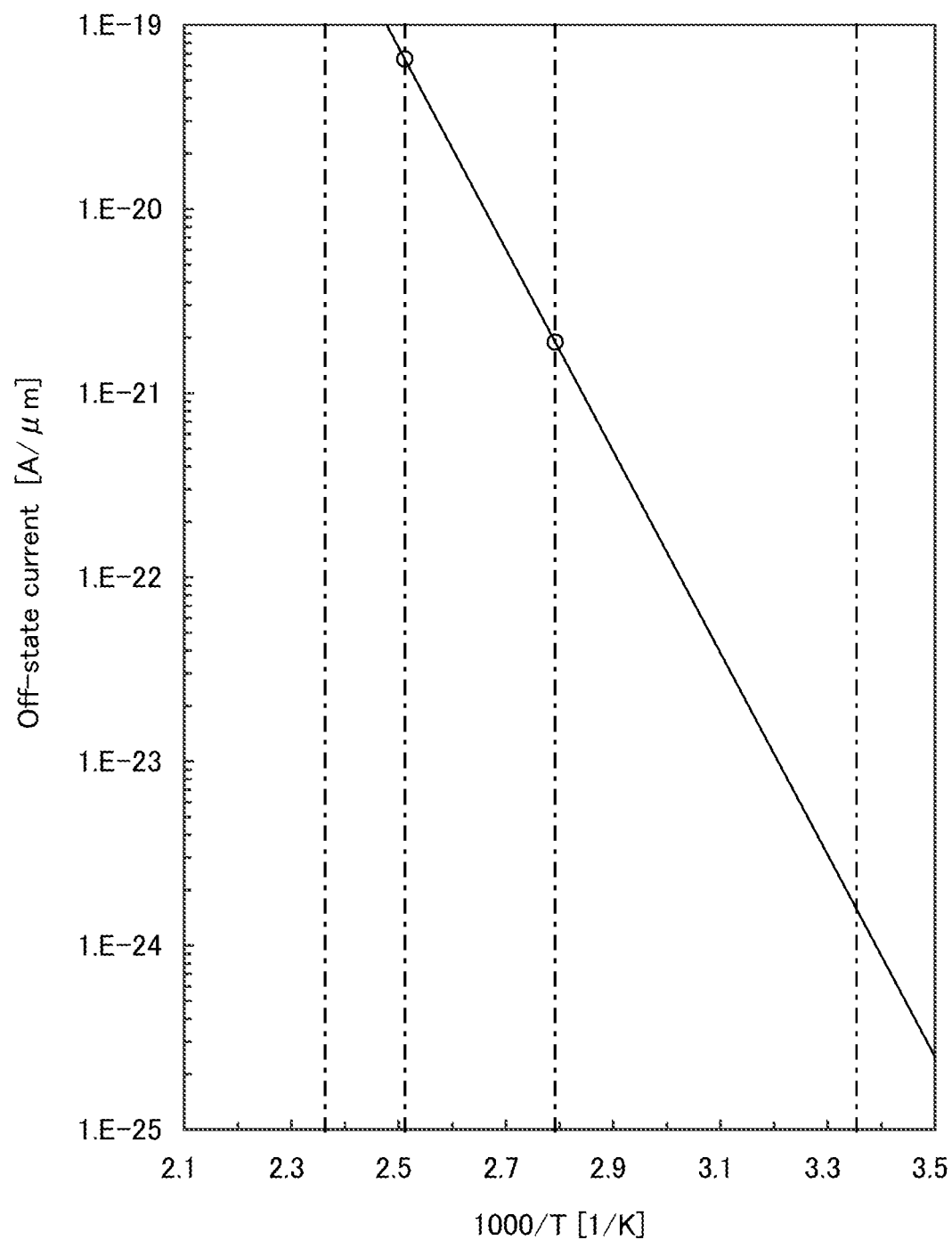
FIG. 19 shows a relationship between the off-state current and the substrate temperature at the time of measurement.

FIG. 19 shows the relation between the off-state current of the transistor of Sample A and the inverse of the substrate temperature (absolute temperature) at measurement.

In FIG. 19, the horizontal axis represents a value (1000/T) obtained by multiplying the inverse of the substrate temperature at measurement by 1000.

The amount of off-state current in FIG. 19 refers to the amount of off-state current per micrometer of the channel width.

The off-state current was less than or equal to $1\times10^{-19}$ A at a substrate temperature of 125° C. (1000/T is about 2.51).

The off-state current was less than or equal to $1\times10^{-20}$ A at a substrate temperature of 85° C. (1000/T is about 2.79).

In other words, it was found that the off-state current of the transistor containing an oxide semiconductor is extremely low as compared to a transistor containing a silicon semiconductor.

The off-state current is decreased as the temperature decreases; therefore, it is clear that the off-state current at ordinary temperature is still lower.

This application is based on Japanese Patent Application serial no. 2011-110391 filed with Japan Patent Office on May 17, 2011, the entire contents of which are hereby incorporated by reference.

What is claimed is:

1. A semiconductor device comprising:
   a first transistor which includes a first oxide semiconductor layer including a first channel formation region;
   a second transistor which includes a second oxide semiconductor layer including a second channel formation region;
   a third transistor including a third channel formation region comprising silicon;
   a fourth transistor including a fourth channel formation region comprising silicon;
   a first wiring electrically connected to one of a source and a drain of the first transistor and one of a source and a drain of the third transistor;
   a second wiring electrically connected to one of a source and a drain of the second transistor and one of a source and a drain of the fourth transistor;
   a third wiring electrically connected to a gate of the first transistor and a gate of the second transistor; and
   a fourth wiring electrically connected to the other of the source and the drain of the third transistor and the other of the source and the drain of the fourth transistor,
   wherein a gate of the third transistor is electrically connected to the other of the source and the drain of the first transistor,
   wherein a gate of the fourth transistor is electrically connected to the other of the source and the drain of the second transistor,
   wherein the one of the source and the drain of the first transistor is electrically connected to the one of the source and the drain of the third transistor through a first connection electrode,
   wherein a material of a gate electrode functioning as the gate of the third transistor is the same as a material of the first connection electrode,
   wherein the first oxide semiconductor layer overlaps with the gate electrode of the third transistor,
   wherein the gate electrode of the third transistor is in direct contact with a bottom surface of the first oxide semiconductor layer, and
   wherein the gate electrode of the third transistor is in direct contact with a bottom surface of an electrode functioning as the other of the source and the drain of the first transistor.

2. The semiconductor device according to claim 1, wherein the third channel formation region and the fourth channel formation region share a same layer.

3. The semiconductor device according to claim 1,
   wherein the first transistor is located over the third transistor,
   wherein the second transistor is located over the fourth transistor,
   wherein the first oxide semiconductor layer overlaps with a semiconductor layer of the third transistor, and
   wherein the second oxide semiconductor layer overlaps with a semiconductor layer of the fourth transistor.

4. The semiconductor device according to claim 3,
   wherein a part of the first oxide semiconductor layer is electrically connected to a part of the semiconductor layer of the third transistor through the first connection electrode, and
   wherein a part of the second oxide semiconductor layer is electrically connected to a part of the semiconductor layer of the fourth transistor through a second connection electrode.

5. The semiconductor device according to claim 4,
   wherein the part of the first oxide semiconductor layer is in direct contact with the first connection electrode,
   wherein another part of the first oxide semiconductor layer is in direct contact with the gate electrode of the third transistor,
   wherein the part of the second oxide semiconductor layer is in direct contact with the second connection electrode, and
   wherein another part of the first oxide semiconductor layer is in direct contact with a gate electrode functioning as the gate of the fourth transistor.

6. The semiconductor device according to claim 5, wherein the first connection electrode, the second connection electrode, the gate electrode of the third transistor, and the gate electrode of the fourth transistor include a same material.

7. The semiconductor device according to claim 5, wherein the first connection electrode, the second connection electrode, the gate electrode of the third transistor, and the gate electrode of the fourth transistor are formed in the same step.

8. The semiconductor device according to claim 1,
   wherein the first transistor, the second transistor, the third transistor, and the fourth transistor are included in a memory cell, and
   wherein the memory cell is configured to hold a charge using a channel capacitance in the third transistor and a channel capacitance in the fourth transistor.

9. The semiconductor device according to claim 1,
wherein the first transistor, the second transistor, the third transistor, and the fourth transistor are included in each of a plurality of memory cells, and
wherein the plurality of memory cells is included in a content addressable memory.

10. The semiconductor device according to claim 1,
wherein the first oxide semiconductor layer comprises In, Sn and Zn, and
wherein the second oxide semiconductor layer comprises In, Sn and Zn.

11. The semiconductor device according to claim 1,
wherein a side surface of the gate electrode of the third transistor is in direct contact with a sidewall insulating layer, and
wherein a side surface of the first connection electrode is in direct contact with a sidewall insulating layer.

12. A semiconductor device comprising:
a first memory cell and a second memory cell, each of the first memory cell and the second memory cell comprising:
   a first transistor which includes a first oxide semiconductor layer including a first channel formation region;
   a second transistor which includes a second oxide semiconductor layer including a second channel formation region;
   a third transistor including a third channel formation region comprising silicon;
   a fourth transistor including a fourth channel formation region comprising silicon; and
   a fifth transistor including a fifth channel formation region comprising silicon,
   wherein a gate of the third transistor is electrically connected to one of a source and a drain of the first transistor,
   wherein a gate of the fourth transistor is electrically connected to one of a source and a drain of the second transistor,
   wherein one of a source and a drain of the fifth transistor is electrically connected to one of a source and a drain of the third transistor and one of a source and a drain of the fourth transistor,
   wherein the first oxide semiconductor layer overlaps with a gate electrode functioning as the gate of the third transistor,
   wherein the gate electrode of the third transistor is in direct contact with a bottom surface of the first oxide semiconductor layer, and
   wherein the gate electrode of the third transistor is in direct contact with a bottom surface of an electrode functioning as the one of the source and the drain of the first transistor;
a first wiring electrically connected to the other of the source and the drain of the first transistor in the first memory cell and the other of the source and the drain of the third transistor in the first memory cell;
a second wiring electrically connected to the other of the source and the drain of the second transistor in the first memory cell and the other of the source and the drain of the fourth transistor in the first memory cell;
a third wiring electrically connected to a gate of the first transistor in each of the first memory cell and the second memory cell and a gate of the second transistor in each of the first memory cell and the second memory cell;
a fourth wiring directly connected to the other of the source and the drain of the fifth transistor in each of the first memory cell and the second memory cell; and
a fifth wiring directly connected to a gate of the fifth transistor in each of the first memory cell and the second memory cell.

13. The semiconductor device according to claim 12,
wherein the third channel formation region, the fourth channel formation region, and the fifth channel formation region share a same layer.

14. The semiconductor device according to claim 12,
wherein the first transistor is located over the third transistor,
wherein the second transistor is located over the fourth transistor,
wherein the first oxide semiconductor layer overlaps with a semiconductor layer of the third transistor, and
wherein the second oxide semiconductor layer overlaps with a semiconductor layer of the fourth transistor.

15. The semiconductor device according to claim 14,
wherein a part of the first oxide semiconductor layer is electrically connected to a part of the semiconductor layer of the third transistor through a first connection electrode, and
wherein a part of the second oxide semiconductor layer is electrically connected to a part of the semiconductor layer of the fourth transistor through a second connection electrode.

16. The semiconductor device according to claim 15,
wherein the part of the first oxide semiconductor layer is in direct contact with the first connection electrode,
wherein another part of the first oxide semiconductor layer is in direct contact with the gate electrode of the third transistor,
wherein the part of the second oxide semiconductor layer is in direct contact with the second connection electrode, and
wherein another part of the second oxide semiconductor layer is in direct contact with a gate electrode functioning as the gate of the fourth transistor.

17. The semiconductor device according to claim 16, wherein the first connection electrode, the second connection electrode, the gate electrode of the third transistor, and the gate electrode of the fourth transistor include a same material.

18. The semiconductor device according to claim 16, wherein the first connection electrode, the second connection electrode, the gate electrode of the third transistor, and the gate electrode of the fourth transistor are formed in the same step.

19. The semiconductor device according to claim 12, wherein each of the first memory cell and the second memory cell is configured to hold a charge using a channel capacitance in the third transistor and a channel capacitance in the fourth transistor.

20. The semiconductor device according to claim 12, wherein the first memory cell and the second memory cell are included in a content addressable memory.

21. The semiconductor device according to claim 12,
wherein the first oxide semiconductor layer comprises In, Sn and Zn, and
wherein the second oxide semiconductor layer comprises In, Sn and Zn.

22. The semiconductor device according to claim 12,
wherein the other of the source and the drain of the first transistor is electrically connected to the other of the source and the drain of the third transistor through a first connection electrode,
wherein a material of the gate electrode of the third transistor is the same as a material of the first connection electrode,
wherein a side surface of the gate electrode functioning as the gate of the third transistor is in direct contact with a sidewall insulating layer, and
wherein a side surface of the first connection electrode is in direct contact with a sidewall insulating layer.

23. The semiconductor device according to claim 12, wherein the gate electrode of the third transistor is a single layer.

* * * * *